US010096945B2

(12) United States Patent
Cartier, Jr. et al.

(10) Patent No.: US 10,096,945 B2
(45) Date of Patent: Oct. 9, 2018

(54) METHOD OF MANUFACTURING A HIGH SPEED ELECTRICAL CONNECTOR

(71) Applicant: Amphenol Corporation, Wallingford Center, CT (US)

(72) Inventors: Marc B. Cartier, Jr., Dover, NH (US); Mark W. Gailus, Concord, MA (US); Thomas S. Cohen, New Boston, NH (US); John Robert Dunham, Windham, NH (US); Vysakh Sivarajan, Nashua, NH (US)

(73) Assignee: Amphenol Corporation, Wallingford, CT (US)

( * ) Notice: Subject to any disclaimer, the term of this patent is extended or adjusted under 35 U.S.C. 154(b) by 0 days.

(21) Appl. No.: 15/376,443

(22) Filed: Dec. 12, 2016

(65) Prior Publication Data

US 2017/0093093 A1 Mar. 30, 2017

Related U.S. Application Data

(62) Division of application No. 14/209,240, filed on Mar. 13, 2014, now Pat. No. 9,520,689.

(Continued)

(51) Int. Cl.
*H05K 3/36* (2006.01)
*H01R 13/6476* (2011.01)

(Continued)

(52) U.S. Cl.
CPC ....... *H01R 13/6476* (2013.01); *H01R 12/585* (2013.01); *H01R 12/724* (2013.01);

(Continued)

(58) Field of Classification Search
CPC .. H01R 13/6476; H01R 43/24; H01R 13/514; H01R 12/724; H01R 12/585;

(Continued)

(56) References Cited

U.S. PATENT DOCUMENTS

| | | | | |
|---|---|---|---|---|
| 6,537,086 B1 * | 3/2003 | MacMullin | .......... | H01R 23/688 439/79 |
| 7,581,990 B2 * | 9/2009 | Kirk | .................... | H01R 13/514 439/607.05 |

(Continued)

FOREIGN PATENT DOCUMENTS

| | | |
|---|---|---|
| CN | 1127783 | 11/2003 |
| CN | 102598430 | 7/2012 |

(Continued)

OTHER PUBLICATIONS

International Search Report and Written Opinion mailed Aug. 12, 2014 for Application No. PCT/US2014/026381 (A0863. 70068W000). [Note — no. copies of U.S. patents, published U.S. patent applications, or pending, unpublished patent applications stored in the Uspto's Image File Wrapper (Ifw) system, are included. See 37 Cfr § 1.98 and 12870G163. Copies of all other patent(s), publication(s), unpublished, pending U.S. patent applications, or other information listed are provided as required by 37 Cfr § 1.98 unless 1) such copies were provided in an Ids in an earlier application that complies with 37 Cfr § 1.98, and 2) the earlier application is relied upon for an earlier filed under 35 U.S.C. § 120.].

*Primary Examiner* — Donghai D Nguyen
(74) *Attorney, Agent, or Firm* — Wolf, Greenfield & Sacks, P.C.

(57) ABSTRACT

An electrical connector designed for high speed signals. The connector includes one or more features that, when used alone or in combination, extend performance to higher speeds. These features may include compensation for tie bars that are used to hold conductive members in place for molding a housing around the conductive members. Removal of the tie bars during manufacture of the connector may leave artifacts in the conductive members and/or housing, which may be addressed by the features. The conductive (Continued)

members, for example, may include regions, adjacent tie bar locations, that compensate for portions of the tie bar that are not fully removed. Alternatively or additionally, a housing may include openings around tie bar locations such that a punch may be used to sever the tie bars. These openings may be filled to avoid performance-affecting artifacts.

7 Claims, 15 Drawing Sheets

Related U.S. Application Data

(60) Provisional application No. 61/778,684, filed on Mar. 13, 2013.

(51) Int. Cl.

| | |
|---|---|
| ***H01R 43/16*** | (2006.01) |
| ***H01R 12/58*** | (2011.01) |
| ***H01R 12/72*** | (2011.01) |
| ***H01R 12/73*** | (2011.01) |
| ***H01R 13/514*** | (2006.01) |
| ***H01R 43/24*** | (2006.01) |

(52) U.S. Cl.
CPC ......... *H01R 12/737* (2013.01); *H01R 13/514* (2013.01); *H01R 43/16* (2013.01); *H01R 43/24* (2013.01); *Y10T 29/49208* (2015.01)

(58) Field of Classification Search
CPC .... H01R 12/737; H01R 43/16; H01R 23/688; Y10T 29/49126; Y10T 29/4208; Y10T 29/49229
USPC ........ 29/830, 874, 876, 883; 439/79, 607.05
See application file for complete search history.

(56) References Cited

U.S. PATENT DOCUMENTS

| | | | |
|---|---|---|---|
| 8,016,616 | B2 | 9/2011 | Glover et al. |
| 8,535,065 | B2 | 9/2013 | Costello et al. |
| 8,550,861 | B2 | 10/2013 | Cohen et al. |
| 9,520,689 | B2 | 12/2016 | Cartier, Jr. et al. |
| 2001/0012730 | A1 | 8/2001 | Ramey et al. |
| 2004/0018757 | A1 | 1/2004 | Lang et al. |
| 2005/0032430 | A1 | 2/2005 | Otsu et al. |
| 2007/0197095 | A1 | 8/2007 | Feldman et al. |
| 2008/0026638 | A1 | 1/2008 | Cohen et al. |
| 2009/0247012 | A1 | 10/2009 | Pan |
| 2010/0099299 | A1 | 4/2010 | Moriyama et al. |
| 2010/0144201 | A1 | 6/2010 | Defibaugh et al. |
| 2010/0144203 | A1 | 6/2010 | Glover et al. |
| 2011/0212650 | A1 | 9/2011 | Amleshi et al. |
| 2012/0077380 | A1 | 3/2012 | Minich et al. |
| 2012/0214344 | A1 | 8/2012 | Cohen et al. |
| 2013/0273781 | A1 | 10/2013 | Buck et al. |
| 2014/0065883 | A1 | 3/2014 | Cohen et al. |

FOREIGN PATENT DOCUMENTS

| | | |
|---|---|---|
| EP | 1 207 587 | 5/2002 |
| JP | 2011-018651 | 1/2011 |
| JP | 2012-516021 | 7/2012 |

* cited by examiner

METHOD OF MANUFACTURING A HIGH SPEED ELECTRICAL CONNECTOR

RELATED APPLICATION

This application is a divisional of and claims priority under § 121 to U.S. patent application Ser. No. 14/209,240, filed Mar. 13, 2014, entitled, "HOUSING FOR A HIGH SPEED ELECTRICAL CONNECTOR," now U.S. Pat. No. 9,520,689, which claims priority under 35 U.S.C. § 119(e) to U.S. Provisional Patent Application Ser. No. 61/778,684, filed Mar. 13, 2013, entitled "HOUSING FOR A HIGH SPEED ELECTRICAL CONNECTOR," all of which applications are herein incorporated by reference in their entirety.

BACKGROUND OF INVENTION

1. Field of Invention

This invention relates generally to electrical interconnection systems and more specifically to high density, high speed electrical connectors.

2. Discussion of Related Art

Electrical connectors are used in many electronic systems. It is generally easier and more cost effective to manufacture a system on several printed circuit boards ("PCBs") that are connected to one another by electrical connectors than to manufacture a system as a single assembly. A traditional arrangement for interconnecting several PCBs is to have one PCB serve as a backplane. Other PCBs, which are called daughter boards or daughter cards, are then connected through the backplane by electrical connectors.

Electronic systems have generally become smaller, faster and functionally more complex. These changes mean that the number of circuits in a given area of an electronic system, along with the frequencies at which the circuits operate, have increased significantly in recent years. Current systems pass more data between printed circuit boards and require electrical connectors that are electrically capable of handling more data at higher speeds than connectors of even a few years ago.

One of the difficulties in making a high density, high speed connector is that electrical conductors in the connector can be so close that there can be electrical interference between adjacent signal conductors. To reduce interference, and to otherwise provide desirable electrical properties, shield members are often placed between or around adjacent signal conductors. The shields prevent signals carried on one conductor from creating "crosstalk" on another conductor. The shield also impacts the impedance of each conductor, which can further contribute to desirable electrical properties. Shields can be in the form of grounded metal structures or may be in the form of electrically lossy material.

Other techniques may be used to control the performance of a connector. Transmitting signals differentially can also reduce crosstalk. Differential signals are carried on a pair of conducting paths, called a "differential pair." The voltage difference between the conductive paths represents the signal. In general, a differential pair is designed with preferential coupling between the conducting paths of the pair. For example, the two conducting paths of a differential pair may be arranged to run closer to each other than to adjacent signal paths in the connector. No shielding is desired between the conducting paths of the pair, but shielding may be used between differential pairs. Electrical connectors can be designed for differential signals as well as for single-ended signals.

Maintaining signal integrity can be a particular challenge in the mating interface of the connector. At the mating interface, force must be generated to press conductive elements from the separable connectors together so that a reliable electrical connection is made between the two conductive elements. Frequently, this force is generated by spring characteristics of the mating contact portions in one of the connectors. For example, the mating contact portions of one connector may contain one or more members shaped as beams. As the connectors are pressed together, these beams are deflected by a mating contact portion, shaped as a post or pin, in the other connector. The spring force generated by the beam as it is deflected provides a contact force.

For mechanical reliability, many contacts have multiple beams. In some instances, the beams are opposing, pressing on opposite sides of a mating contact portion of a conductive element from another connector. The beams may alternatively be parallel, pressing on the same side of a mating contact portion.

Regardless of the specific contact structure, the need to generate mechanical force imposes requirements on the shape of the mating contact portions. For example, the mating contact portions must be large enough to generate sufficient force to make a reliable electrical connection.

These mechanical requirements may preclude the use of shielding or may dictate the use of conductive material in places that alters the impedance of the conductive elements in the vicinity of the mating interface. Because abrupt changes in the impedance of a signal conductor can alter the signal integrity of that conductor, the mating contact portions are often accepted as being the noisy portion of the connector.

SUMMARY

In accordance with techniques described herein, improved performance of an electrical connector may be provided with a housing that has at least two portions. The second portion may be shaped to fill openings in the first portion. The openings may be along a surface of the first housing. Such openings, and other openings positioned in other locations on the first portion may be formed to sever tie bars in a lead frame used in making the connector.

Accordingly, some embodiments relate to an electrical connector, comprising a plurality of conductive members, each comprising a contact tail, a mating contact and an intermediate portion joining the contact tail and the mating contact. The connector may have a housing, the housing comprising a first portion and a second portion. The intermediate portion of each of the plurality of conductive members is disposed within the housing. The first portion may have a first surface, the first surface comprising a plurality of recesses formed therein. The second portion may have a second surface, the second surface comprising a plurality of projections, the projections being aligned with the recesses. The plurality of conductive members extend through the first surface and the second surface.

In another aspect, embodiments may relate to a method of manufacturing an electrical connector. The method may include molding a housing around a lead frame, the lead frame comprising a plurality of conductive members, the plurality of conductive members being joined by a plurality of tie bars. Subsequent to the molding, with at least one punch, the tie bars may be severed, the at least one punch passing through open areas of the housing to access the tie bars. The method may further include inserting insulative members in the open areas.

In yet another aspect, an electrical connector may be provided. The electrical connector may comprise an insulative member comprising a plurality of openings therethrough and a plurality of subassemblies. Each of the subassemblies may comprise a housing having a first surface and a second surface opposing the first surface and at least one edge perpendicular to and joining the opposing first and second surfaces. The subassemblies also may each comprise a plurality of conductive members partially disposed within the housing with a portion extending through the edge. The subassemblies may be positioned with the edges of the subassemblies adjacent the insulative member such that, for each subassembly, the portions of the conductive members extending from the housing extend through openings in the insulative member. The edge of each of the plurality of subassemblies may comprise recesses therein. The insulative member may comprise projections extending into the recesses.

The foregoing is a non-limiting summary of the invention, which is defined by the appended claims.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

The inventors have recognized and appreciated that performance of an electrical interconnection system may be improved through the use of dielectric inserts in the housing of a connector forming a portion of the interconnection system. In particular, the inventors have recognized and appreciated that some manufacturing processes for electrical connectors result in cavities in a dielectric housing that holds conductive members of the connector. Though the cavities may seem small, the inventors have recognized and appreciated that in some locations within the connector, even small cavities can change the high frequency impedance of conductive members acting as signal conductors. These changes in impedance may create signal reflections or mode conversions that in turn create cross-talk and/or excite resonances in the connector that degrade signal performance.

Accordingly, in some embodiments, an electrical connector may be manufactured with one or more dielectric inserts to fill cavities in a connector housing. In some embodiments, these cavities are created during or to support manufacturing steps in which a tool contacts a lead frame used to form the conductive elements in the connector. As a specific example, the lead frame may be stamped with tie bars, which may ensure a desired spacing between conductive elements. Before the connector can be used, the tie bars are severed to ensure that the conductive elements are electrically isolated from each other within the connector. The connector housing may be formed with a cavity exposing the tie bar such that a punch, or other tool, used to sever the tie bars can access the tie bar without cutting the housing, which could dull the tool quickly. Though, even if the housing is not formed with a cavity, the punch or other tool may create such a cavity within the housing when severing the tie bar.

The inventors have recognized and appreciated that such cavities in a surface of a connector configured for attachment to a printed circuit board may be particularly undesirable for high frequency performance such that a member, attached to the housing to fill the cavities in the housing in a surface intended to be mounted against a printed circuit board may improve high frequency performance of the connector, and therefore the entire interconnection system.

Figure 1:
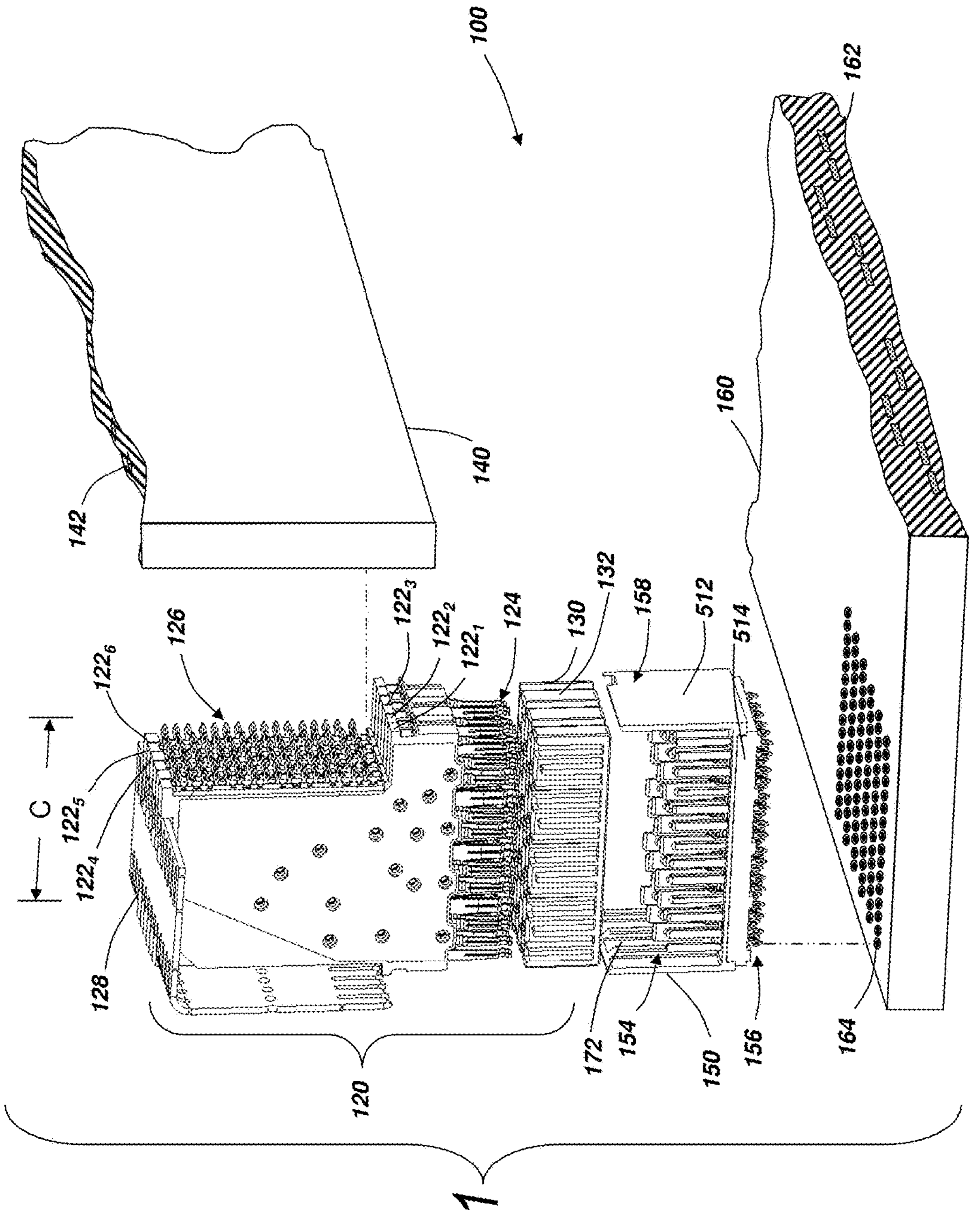
FIG. 1 is a perspective view of an electrical interconnection system illustrating an environment in which embodiments of the invention may be applied.

Techniques as described herein to improve the high frequency performance of an electrical interconnection system may be applied to connectors of any suitable form. However, an example of a connector that may be improved using techniques as described herein is provided in connection with FIGS. 1-9B. Referring to FIG. 1, an electrical interconnection system 100 with two connectors is shown. The electrical interconnection system 100 includes a daughter card connector 120 and a backplane connector 150.

Daughter card connector 120 is designed to mate with backplane connector 150, creating electronically conducting paths between backplane 160 and daughter card 140. Though not expressly shown, interconnection system 100 may interconnect multiple daughter cards having similar daughter card connectors that mate to similar backplane connections on backplane 160. Accordingly, the number and type of subassemblies connected through an interconnection system is not a limitation on the invention.

Backplane connector 150 and daughter connector 120 each contains conductive elements. The conductive elements of daughter card connector 120 are coupled to traces, of which trace 142 is numbered, ground planes or other conductive elements within daughter card 140. The traces carry electrical signals and the ground planes provide reference levels for components on daughter card 140. Ground planes may have voltages that are at earth ground or positive or negative with respect to earth ground, as any voltage level may act as a reference level.

Similarly, conductive elements in backplane connector 150 are coupled to traces, of which trace 162 is numbered, ground planes or other conductive elements within backplane 160. When daughter card connector 120 and backplane connector 150 mate, conductive elements in the two connectors mate to complete electrically conductive paths between the conductive elements within backplane 160 and daughter card 140.

Figure 6C:
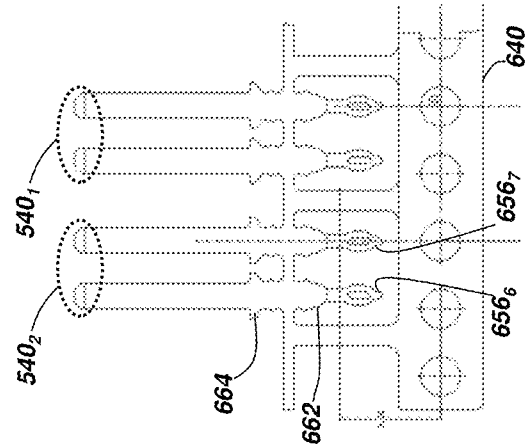
FIGS. 6A-6C are enlarged detail views of conductors used in the manufacture of a backplane connector of FIG. 5A.
Figure 6B:
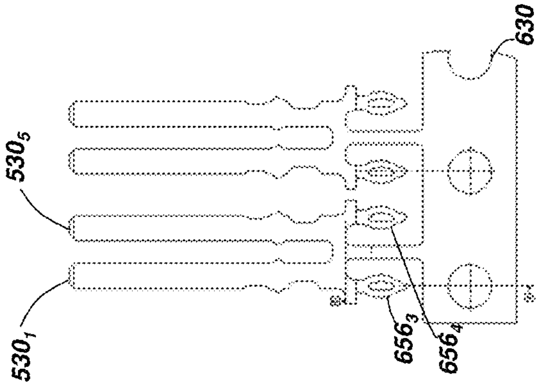
Figure 6A:
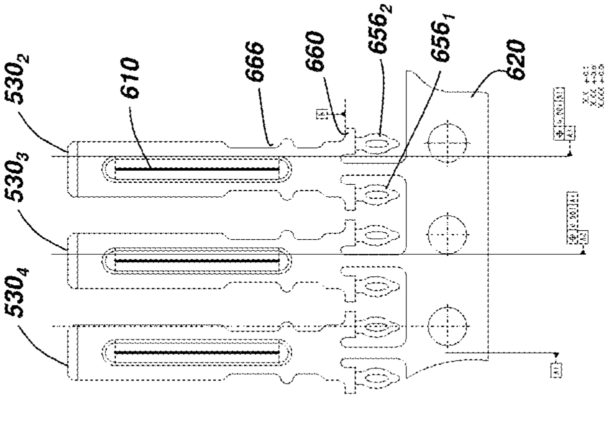

Backplane connector 150 includes a backplane shroud 158 and a plurality of conductive elements (see FIGS. 6A-6C). The conductive elements of backplane connector 150 extend through floor 514 of the backplane shroud 158 with portions both above and below floor 514. Here, the portions of the conductive elements that extend above floor 514 form mating contacts, shown collectively as mating contact portions 154, which are adapted to mate to corresponding conductive elements of daughter card connector 120. In the illustrated embodiment, mating contacts 154 are in the form of blades, although other suitable contact configurations may be employed, as the present invention is not limited in this regard.

Tail portions, shown collectively as contact tails 156, of the conductive elements extend below the shroud floor 514 and are adapted to be attached to backplane 160. Here, the tail portions are in the form of a press fit, "eye of the needle" compliant sections that fit within via holes, shown collectively as via holes 164, on backplane 160. However, other configurations are also suitable, such as surface mount elements, spring contacts, solderable pins, etc., as the present invention is not limited in this regard.

In the embodiment illustrated, backplane shroud 158 is molded from a dielectric material such as plastic or nylon. Examples of suitable materials are liquid crystal polymer (LCP), polyphenyline sulfide (PPS), high temperature nylon or polypropylene (PPO). Other suitable materials may be employed, as the present invention is not limited in this regard. All of these are suitable for use as binder materials in manufacturing connectors according to the invention. One or more fillers may be included in some or all of the binder material used to form backplane shroud 158 to control the electrical or mechanical properties of backplane shroud 150. For example, thermoplastic PPS filled to 30% by volume with glass fiber may be used to form shroud 158.

In the embodiment illustrated, backplane connector 150 is manufactured by molding backplane shroud 158 with openings to receive conductive elements. The conductive elements may be shaped with barbs or other retention features that hold the conductive elements in place when inserted in the opening of backplane shroud 158.

Figure 5A:
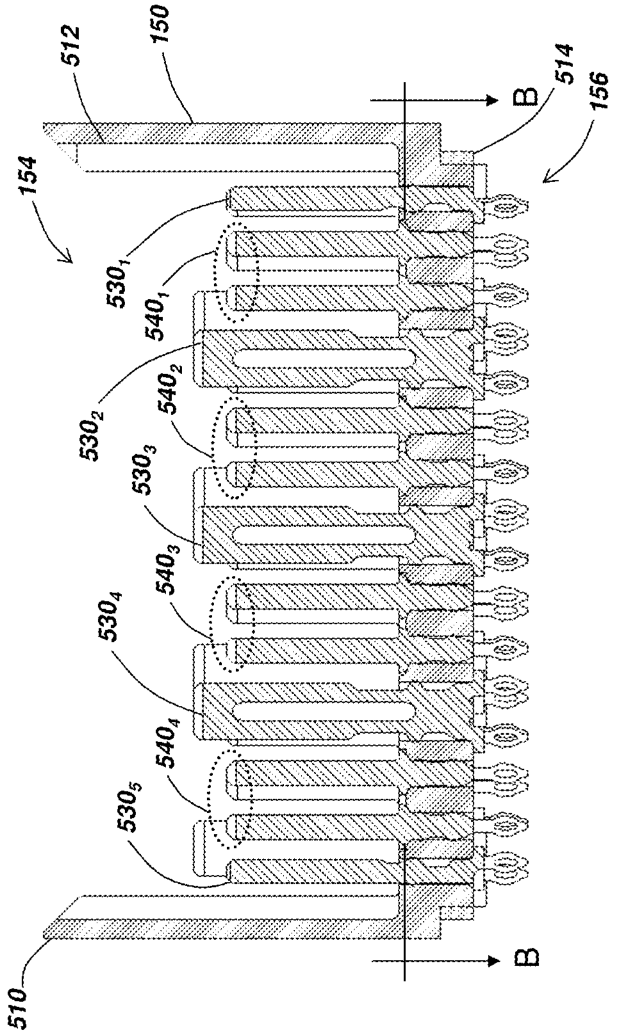
FIG. 5A is a cross-sectional representation of a backplane connector in the interconnection system of FIG. 1.

As shown in FIG. 1 and FIG. 5A, the backplane shroud 158 further includes side walls 512 that extend along the length of opposing sides of the backplane shroud 158. The side walls 512 include grooves 172, which run vertically along an inner surface of the side walls 512. Grooves 172 serve to guide front housing 130 of daughter card connector 120 via mating projections 132 into the appropriate position in shroud 158.

Daughter card connector 120 includes a plurality of wafers $122_1$ . . . $122_6$ coupled together, with each of the plurality of wafers $122_1$ . . . $122_6$ having a housing 260 (see FIGS. 2A-2C) and a column of conductive elements. In the illustrated embodiment, each column has a plurality of signal conductors 420 (see FIG. 4A) and a plurality of ground conductors 430 (see FIG. 4A). The ground conductors may be employed within each wafer $122_1$ . . . $122_6$ to minimize crosstalk between signal conductors or to otherwise control the electrical properties of the connector.

Wafers $122_1$ . . . $122_6$ may be formed by molding housing 260 around conductive elements that form signal and ground conductors. As with shroud 158 of backplane connector 150, housing 260 may be formed of any suitable material and may include portions that have conductive filler or are otherwise made lossy.

In the illustrated embodiment, daughter card connector 120 is a right angle connector and has conductive elements that traverse a right angle. As a result, opposing ends of the conductive elements extend from perpendicular edges of the wafers $122_1$ . . . $122_6$.

Each conductive element of wafers $122_1$ . . . $122_6$ has at least one contact tail, shown collectively as contact tails 126, that can be connected to daughter card 140. Each conductive element in daughter card connector 120 also has a mating contact portion, shown collectively as mating contacts 124, which can be connected to a corresponding conductive element in backplane connector 150. Each conductive element also has an intermediate portion between the mating contact portion and the contact tail, which may be enclosed by or embedded within a wafer housing 260 (see FIG. 2).

The contact tails 126 extend through a surface of daughter card connector 120 adapted to be mounted to daughter card 140. The contact tails 126 electrically connect the conductive elements within daughter card 140 and connector 120 to conductive elements, such as traces 142 in daughter card 140. In the embodiment illustrated, contact tails 126 are press fit "eye of the needle" contacts that make an electrical connection through via holes in daughter card 140. However, any suitable attachment mechanism may be used instead of or in addition to via holes and press fit contact tails.

In the illustrated embodiment, each of the mating contacts 124 has a dual beam structure configured to mate to a corresponding mating contact 154 of backplane connector 150. Though, conductive elements with other shapes may be substituted for some or all of the conductive elements illustrated in FIG. 1 that have dual beam mating contact portions as a way to reduce spacing between mating contact portions.

In some embodiments, the conductive elements acting as signal conductors may be grouped in pairs, separated by ground conductors in a configuration suitable for use as a differential electrical connector. However, embodiments are possible for single-ended use in which the conductive elements are evenly spaced without designated ground conductors separating signal conductors or with a ground conductor between each signal conductor.

In the embodiments illustrated, some conductive elements are designated as forming a differential pair of conductors and some conductive elements are designated as ground conductors. These designations refer to the intended use of the conductive elements in an interconnection system as they would be understood by one of skill in the art. For example, though other uses of the conductive elements may be possible, differential pairs may be identified based on preferential coupling between the conductive elements that make up the pair. Electrical characteristics of the pair, such as its impedance, that make it suitable for carrying a differential signal may provide an alternative or additional method of identifying a differential pair. As another example, in a connector with differential pairs, ground conductors may be identified by their positioning relative to the differential pairs. In other instances, ground conductors may be identified by their shape or electrical characteristics. For example, ground conductors may be relatively wide to provide low inductance, which is desirable for providing a stable reference potential, but provides an impedance that is undesirable for carrying a high speed signal.

FIG. 1 illustrates that conductive elements with the connectors are arranged in arrays. Here the arrays include multiple parallel columns of conductive elements, with the columns running in the direction indicated C. In the illustrated embodiment, each column as an equal number of conductive elements designated as signal conductors. However, adjacent columns have different configurations of signal and ground conductors. Though, every other column has the same configuration in the embodiment illustrated.

A connector as shown in FIG. 1 may be assembled for multiple wafers held in parallel. Each of the wafers may carry at least one column of conductive elements and may include a housing that provides mechanical support for the conductive elements and/or provides material in the vicinity of the conductive elements to impact electrical properties.

For exemplary purposes only, daughter card connector is illustrated with six wafers $\mathbf{122}_1 \ldots \mathbf{122}_6$, with each wafer having a plurality of pairs of signal conductors and adjacent ground conductors. As pictured, each of the wafers $\mathbf{122}_1 \ldots \mathbf{122}_6$ includes one column of conductive elements. However, the present invention is not limited in this regard, as the number of wafers and the number of signal conductors and ground conductors in each wafer may be varied as desired.

As shown, each wafer $\mathbf{122}_1 \ldots \mathbf{122}_6$ is inserted into front housing 130 such that mating contacts 124 are inserted into and held within openings in front housing 130. The openings in front housing 130 are positioned so as to allow mating contacts 154 of the backplane connector 150 to enter the openings in front housing 130 and allow electrical connection with mating contacts 124 when daughter card connector 120 is mated to backplane connector 150.

Daughter card connector 120 may include a support member instead of or in addition to front housing 130 to hold wafers $\mathbf{122}_1 \ldots \mathbf{122}_6$. In the pictured embodiment, stiffener 128 supports the plurality of wafers $\mathbf{122}_1 \ldots \mathbf{122}_6$. Stiffener 128 is, in the embodiment illustrated, a stamped metal member. Though, stiffener 128 may be formed from any suitable material. Stiffener 128 may be stamped with slots, holes, grooves or other features that can engage a plurality of wafers to support the wafers in the desired orientation.

Each wafer $\mathbf{122}_1 \ldots \mathbf{122}_6$ may include attachment features 242, 244 (see FIGS. 2A-2B) that engage stiffener 128 to locate each wafer 122 with respect to another and further to prevent rotation of the wafer 122. Of course, the present invention is not limited in this regard, and no stiffener need be employed. Further, although the stiffener is shown attached to an upper and side portion of the plurality of wafers, the present invention is not limited in this respect, as other suitable locations may be employed.

Figure 2B:
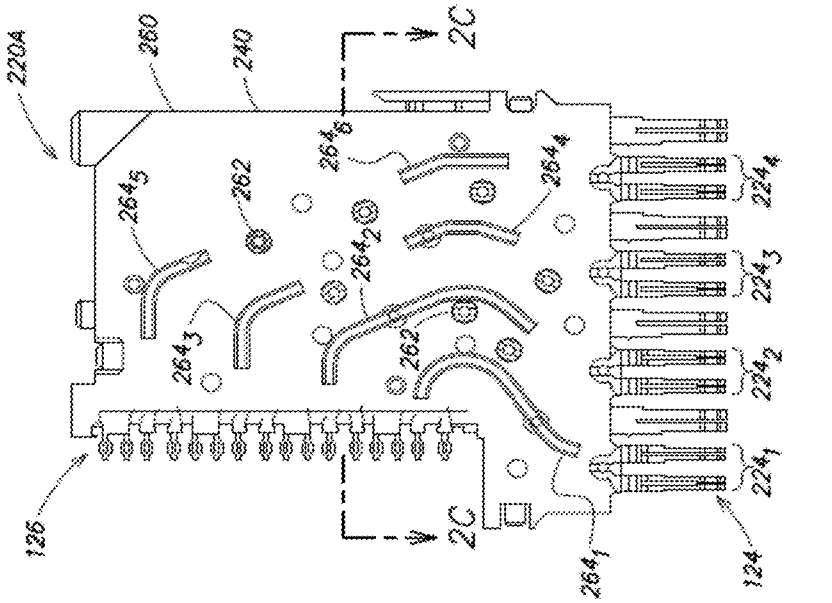
FIGS. 2A and 2B are views of a first and second side of a wafer forming a portion of the electrical connector of FIG. 1.
Figure 2A:
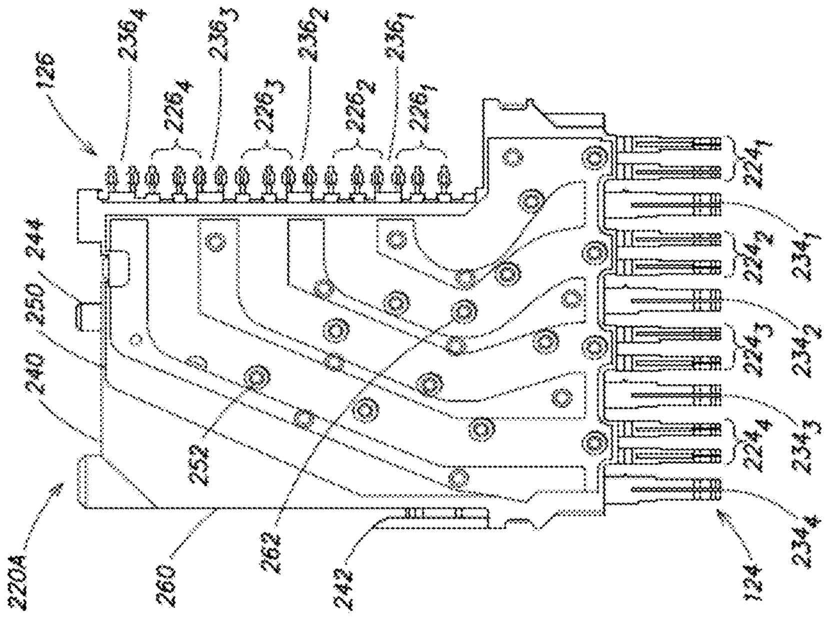

FIGS. 2A-2B illustrate opposing side views of an exemplary wafer 220A. Wafer 220A may be formed in whole or in part by injection molding of material to form housing 260 around a wafer strip assembly such as 410A or 410B (FIG. 4). In the pictured embodiment, wafer 220A is formed with a two shot molding operation, allowing housing 260 to be formed of two types of material having different material properties. Insulative portion 240 is formed in a first shot and lossy portion 250 is formed in a second shot. However, any suitable number and types of material may be used in housing 260. In one embodiment, the housing 260 is formed around a column of conductive elements by injection molding plastic.

In some embodiments, housing 260 may be provided with openings, such as windows or slots $\mathbf{264}_1 \ldots \mathbf{264}_6$, and holes, of which hole 262 is numbered, adjacent the signal conductors 420. These openings may serve multiple purposes, including to: (i) ensure during an injection molding process that the conductive elements are properly positioned, and (ii) facilitate insertion of materials that have different electrical properties, if so desired.

To obtain the desired performance characteristics, some embodiments may employ regions of different dielectric constant selectively located adjacent signal conductors $\mathbf{310}_1$B, $\mathbf{310}_2$B . . . $\mathbf{310}_4$B of a wafer. For example, in the embodiment illustrated in FIGS. 2A-2C, the housing 260 includes slots $\mathbf{264}_1 \ldots \mathbf{264}_6$ in housing 260 that position air adjacent signal conductors $\mathbf{310}_1$B, $\mathbf{310}_2$B . . . $\mathbf{310}_4$B.

The ability to place air, or other material that has a dielectric constant lower than the dielectric constant of material used to form other portions of housing 260, in close proximity to one half of a differential pair provides a mechanism to de-skew a differential pair of signal conductors. The time it takes an electrical signal to propagate from one end of the signal conductor to the other end is known as the propagation delay. In some embodiments, it is desirable that both signal conductors within a pair have the same propagation delay, which is commonly referred to as having zero skew within the pair. The propagation delay within a conductor is influenced by the dielectric constant of material near the conductor, where a lower dielectric constant means a lower propagation delay. The dielectric constant is also sometimes referred to as the relative permittivity. A vacuum has the lowest possible dielectric constant with a value of 1. Air has a similarly low dielectric constant, whereas dielectric materials, such as LCP, have higher dielectric constants. For example, LCP has a dielectric constant of between about 2.5 and about 4.5.

Each signal conductor of the signal pair may have a different physical length, particularly in a right-angle connector. According to one aspect of the invention, to equalize the propagation delay in the signal conductors of a differential pair even though they have physically different lengths, the relative proportion of materials of different dielectric constants around the conductors may be adjusted. In some embodiments, more air is positioned in close proximity to the physically longer signal conductor of the pair than for the shorter signal conductor of the pair, thus lowering the effective dielectric constant around the signal conductor and decreasing its propagation delay.

However, as the dielectric constant is lowered, the impedance of the signal conductor rises. To maintain balanced impedance within the pair, the size of the signal conductor in closer proximity to the air may be increased in thickness or width. This results in two signal conductors with different physical geometry, but a more equal propagation delay and more inform impedance profile along the pair.

Figure 2C:
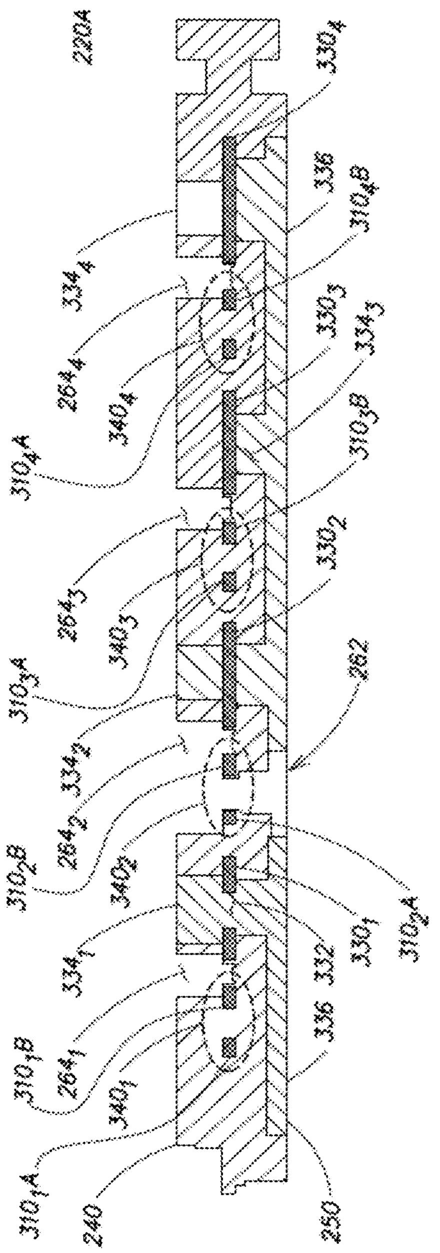
FIG. 2C is a cross-sectional representation of the wafer illustrated in FIG. 2B en along the line 2C-2C.

FIG. 2C shows a wafer 220 in cross section taken along the line 2C-2C in FIG. 2B. As shown, a plurality of differential pairs $\mathbf{340}_1 \ldots \mathbf{340}_4$ are held in an array within insulative portion 240 of housing 260. In the illustrated embodiment, the array, in cross-section, is a linear array, forming a column of conductive elements.

Slots $264_1$ . . . $264_4$ are intersected by the cross section and are therefore visible in FIG. 2C. As can be seen, slots $264_1$ . . . $264_4$ create regions of air adjacent the longer conductor in each differential pair $340_1$, $340_2$ . . . $340_4$. Though, air is only one example of a material with a low dielectric constant that may be used for de-skewing a connector. Regions comparable to those occupied by slots $264_1$ . . . $264_4$ as shown in FIG. 2C could be formed with a plastic with a lower dielectric constant than the plastic used to form other portions of housing 260. As another example, regions of lower dielectric constant could be formed using different types or amounts of fillers. For example, lower dielectric constant regions could be molded from plastic having less glass fiber reinforcement than in other regions.

FIG. 2C also illustrates positioning and relative dimensions of signal and ground conductors that may be used in some embodiments. As shown in FIG. 2C, intermediate portions of the signal conductors $310_1$A . . . $310_4$A and $310_1$B . . . $310_4$B are embedded within housing 260 to form a column. Intermediate portions of ground conductors $330_1$ . . . $330_4$ may also be held within housing 260 in the same column.

Ground conductors $330_1$, $330_2$ and $330_3$ are positioned between two adjacent differential pairs $340_1$, $340_2$ . . . $340_4$ within the column. Additional ground conductors may be included at either or both ends of the column. In wafer 220A, as illustrated in FIG. 2C, a ground conductor $330_4$ is positioned at one end of the column. As shown in FIG. 2C, in some embodiments, each ground conductor $330_1$ . . . $330_4$ is preferably wider than the signal conductors of differential pairs $340_1$ . . . $340_4$. In the cross-section illustrated, the intermediate portion of each ground conductor has a width that is equal to or greater than three times the width of the intermediate portion of a signal conductor. In the pictured embodiment, the width of each ground conductor is sufficient to span at least the same distance along the column as a differential pair.

In the pictured embodiment, each ground conductor has a width approximately five times the width of a signal conductor such that in excess of 50% of the column width occupied by the conductive elements is occupied by the ground conductors. In the illustrated embodiment, approximately 70% of the column width occupied by conductive elements is occupied by the ground conductors $330_1$ . . . $330_4$. Increasing the percentage of each column occupied by a ground conductor can decrease cross talk within the connector. However, one approach to increasing the number of signal conductors per unit length in the column direction (illustrated by dimension C in FIG. 1) is to decrease the width of each ground conductor. Accordingly, though FIG. 2C shows the ratio of widths between ground and signal conductors to be approximately 3:1, lower ratios may be used to improve density. In some embodiments, the ratio may be 2:1 or less.

Other techniques can also be used to manufacture wafer 220A to reduce crosstalk or otherwise have desirable electrical properties. In some embodiments, one or more portions of the housing 260 are formed from a material that selectively alters the electrical and/or electromagnetic properties of that portion of the housing, thereby suppressing noise and/or crosstalk, altering the impedance of the signal conductors or otherwise imparting desirable electrical properties to the signal conductors of the wafer.

In the embodiment illustrated in FIGS. 2A-2C, housing 260 includes an insulative portion 240 and a lossy portion 250. In one embodiment, the lossy portion 250 may include a thermoplastic material filled with conducting particles. The fillers make the portion "electrically lossy." In one embodiment, the lossy regions of the housing are configured to reduce crosstalk between at least two adjacent differential pairs $340_1$ . . . $340_4$. The insulative regions of the housing may be configured so that the lossy regions do not attenuate signals carried by the differential pairs $340_1$ . . . $340_4$ an undesirable amount.

Materials that conduct, but with some loss, over the frequency range of interest are referred to herein generally as "lossy" materials. Electrically lossy materials can be formed from lossy dielectric and/or lossy conductive materials. The frequency range of interest depends on the operating parameters of the system in which such a connector is used, but will generally be between about 1 GHz and 25 GHz, though higher frequencies or lower frequencies may be of interest in some applications. Some connector designs may have frequency ranges of interest that span only a portion of this range, such as 1 to 10 GHz or 3 to 15 GHz or 3 to 6 GHz.

Electrically lossy material can be formed from material traditionally regarded as dielectric materials, such as those that have an electric loss tangent greater than approximately 0.003 in the frequency range of interest. The "electric loss tangent" is the ratio of the imaginary part to the real part of the complex electrical permittivity of the material.

Electrically lossy materials can also be formed from materials that are generally thought of as conductors, but are either relatively poor conductors over the frequency range of interest, contain particles or regions that are sufficiently dispersed that they do not provide high conductivity or otherwise are prepared with properties that lead to a relatively weak bulk conductivity over the frequency range of interest. Electrically lossy materials typically have a conductivity of about 1 siemans/meter to about $6.1\times10^7$ siemans/meter, preferably about 1 siemans/meter to about $1\times10^7$ siemans/meter and most preferably about 1 siemans/meter to about 30,000 siemans/meter.

Electrically lossy materials may be partially conductive materials, such as those that have a surface resistivity between 1 Ω/square and $10^6$ Ω/square. In some embodiments, the electrically lossy material has a surface resistivity between 1 Ω/square and $10^3$ Ω/square. In some embodiments, the electrically lossy material has a surface resistivity between 10 Ω/square and 100 Ω/square. As a specific example, the material may have a surface resistivity of between about 20 Ω/square and 40 Ω/square.

In some embodiments, electrically lossy material is formed by adding to a binder a filler that contains conductive particles. Examples of conductive particles that may be used as a filler to form an electrically lossy material include carbon or graphite formed as fibers, flakes or other particles. Metal in the form of powder, flakes, fibers or other particles may also be used to provide suitable electrically lossy properties. Alternatively, combinations of fillers may be used. For example, metal plated carbon particles may be used. Silver and nickel are suitable metal plating for fibers. Coated particles may be used alone or in combination with other fillers, such as carbon flake. In some embodiments, the conductive particles disposed in the lossy portion 250 of the housing may be disposed generally evenly throughout, rendering a conductivity of the lossy portion generally constant. In other embodiments, a first region of the lossy portion 250 may be more conductive than a second region of the lossy portion 250 so that the conductivity, and therefore amount of loss within the lossy portion 250 may vary.

The binder or matrix may be any material that will set, cure or can otherwise be used to position the filler material.

In some embodiments, the binder may be a thermoplastic material such as is traditionally used in the manufacture of electrical connectors to facilitate the molding of the electrically lossy material into the desired shapes and locations as part of the manufacture of the electrical connector. However, many alternative forms of binder materials may be used. Curable materials, such as epoxies, can serve as a binder. Alternatively, materials such as thermosetting resins or adhesives may be used. Also, while the above described binder materials may be used to create an electrically lossy material by forming a binder around conducting particle fillers, the invention is not so limited. For example, conducting particles may be impregnated into a formed matrix material or may be coated onto a formed matrix material, such as by applying a conductive coating to a plastic housing. As used herein, the term "binder" encompasses a material that encapsulates the filler, is impregnated with the filler or otherwise serves as a substrate to hold the filler.

Preferably, the fillers will be present in a sufficient volume percentage to allow conducting paths to be created from particle to particle. For example, when metal fiber is used, the fiber may be present in about 3% to 40% by volume. The amount of filler may impact the conducting properties of the material.

Filled materials may be purchased commercially, such as materials sold under the trade name Celestran® by Ticona. A lossy material, such as lossy conductive carbon filled adhesive preform, such as those sold by Techfilm of Billerica, Mass., US may also be used. This preform can include an epoxy binder filled with carbon particles. The binder surrounds carbon particles, which acts as a reinforcement for the preform. Such a preform may be inserted in a wafer 220A to form all or part of the housing and may be positioned to adhere to ground conductors in the wafer. In some embodiments, the preform may adhere through the adhesive in the preform, which may be cured in a heat treating process. Various forms of reinforcing fiber, in woven or non-woven form, coated or non-coated may be used. Non-woven carbon fiber is one suitable material. Other suitable materials, such as custom blends as sold by RTP Company, can be employed, as the present invention is not limited in this respect.

In the embodiment illustrated in FIG. 2C, the wafer housing 260 is molded with two types of material. In the pictured embodiment, lossy portion 250 is formed of a material having a conductive filler, whereas the insulative portion 240 is formed from an insulative material having little or no conductive fillers, though insulative portions may have fillers, such as glass fiber, that alter mechanical properties of the binder material or impacts other electrical properties, such as dielectric constant, of the binder. In one embodiment, the insulative portion 240 is formed of molded plastic and the lossy portion is formed of molded plastic with conductive fillers. In some embodiments, the lossy portion 250 is sufficiently lossy that it attenuates radiation between differential pairs to a sufficient amount that crosstalk is reduced to a level that a separate metal plate is not required.

To prevent signal conductors $\mathbf{310}_1$A, $\mathbf{310}_1$B . . . $\mathbf{310}_4$A, and $\mathbf{310}_4$B from being shorted together and/or from being shorted to ground by lossy portion 250, insulative portion 240, formed of a suitable dielectric material, may be used to insulate the signal conductors. The insulative materials may be, for example, a thermoplastic binder into which non-conducting fibers are introduced for added strength, dimensional stability and to reduce the amount of higher priced binder used. Glass fibers, as in a conventional electrical connector, may have a loading of about 30% by volume. It should be appreciated that in other embodiments, other materials may be used, as the invention is not so limited.

In the embodiment of FIG. 2C, the lossy portion 250 includes a parallel region 336 and perpendicular regions $\mathbf{334}_1$ . . . $\mathbf{334}_4$. In one embodiment, perpendicular regions $\mathbf{334}_1$ . . . $\mathbf{334}_4$ are disposed between adjacent conductive elements that form separate differential pairs $\mathbf{340}_1$ . . . $\mathbf{340}_4$.

In some embodiments, the lossy regions 336 and $\mathbf{334}_1$ . . . $\mathbf{334}_4$ of the housing 260 and the ground conductors $\mathbf{330}_1$ . . . $\mathbf{330}_4$ cooperate to shield the differential pairs $\mathbf{340}_1$ . . . $\mathbf{340}_4$ to reduce crosstalk. The lossy regions 336 and $\mathbf{334}_1$ . . . $\mathbf{334}_4$ may be grounded by being electrically coupled to one or more ground conductors. Such coupling may be the result of direct contact between the electrically lossy material and a ground conductor or may be indirect, such as through capacitive coupling. This configuration of lossy material in combination with ground conductors $\mathbf{330}_1$ . . . $\mathbf{330}_4$ reduces crosstalk between differential pairs within a column.

As shown in FIG. 2C, portions of the ground conductors $\mathbf{330}_1$ . . . $\mathbf{330}_4$, may be electrically connected to regions 336 and $\mathbf{334}_1$ . . . $\mathbf{334}_4$ by molding portion 250 around ground conductors $\mathbf{340}_1$ . . . $\mathbf{340}_4$. In some embodiments, ground conductors may include openings through which the material forming the housing can flaw during molding. For example, the cross section illustrated in FIG. 2C is taken through an opening 332 in ground conductor $\mathbf{330}_1$. Though not visible in the cross section of FIG. 2C, other openings in other ground conductors such as $\mathbf{330}_2$ . . . $\mathbf{330}_4$ may be included.

Material that flows through openings in the ground conductors allows perpendicular portions $\mathbf{334}_1$ . . . $\mathbf{334}_4$ to extend through ground conductors even though a mold cavity used to form a wafer 220A has inlets on only one side of the ground conductors. Additionally, flowing material through openings in ground conductors as part of a molding operation may aid in securing the ground conductors in housing 260 and may enhance the electrical connection between the lossy portion 250 and the ground conductors. However, other suitable methods of forming perpendicular portions $\mathbf{334}_1$ . . . $\mathbf{334}_4$ may also be used, including molding wafer 320A in a cavity that has inlets on two sides of ground conductors $\mathbf{330}_1$ . . . $\mathbf{330}_4$. Likewise, other suitable methods for securing the ground contacts 330 may be employed, as the present invention is not limited in this respect.

Forming the lossy portion 250 of the housing from a moldable material can provide additional benefits. For example, the lossy material at one or more locations can be configured to set the performance of the connector at that location. For example, changing the thickness of a lossy portion to space signal conductors closer to or further away from the lossy portion 250 can alter the performance of the connector. As such, electromagnetic coupling between one differential pair and ground and another differential pair and ground can be altered, thereby configuring the amount of loss for radiation between adjacent differential pairs and the amount of loss to signals carried by those differential pairs. As a result, a connector according to embodiments of the invention may be capable of use at higher frequencies than conventional connectors, such as for example at frequencies between 10-25 GHz.

As shown in the embodiment of FIG. 2C, wafer 220A is designed to carry differential signals. Thus, each signal is carried by a pair of signal conductors $\mathbf{310}_1$A and $\mathbf{310}_1$B, . . . $\mathbf{310}_4$A, and $\mathbf{310}_4$B. Preferably, each signal conductor is closer to the other conductor in its pair than it is to a conductor in an adjacent pair. For example, a pair $\mathbf{340}_1$ carries one differential signal, and pair $340_2$ carries another differential signal. As can be seen in the cross section of FIG. 2C, signal conductor $310_1$B is closer to signal conductor $310_1$A than to signal conductor $310_2$A. Perpendicular lossy regions $334_1$ . . . $334_4$ may be positioned between pairs to provide shielding between the adjacent differential pairs in the same column.

Figure 3:
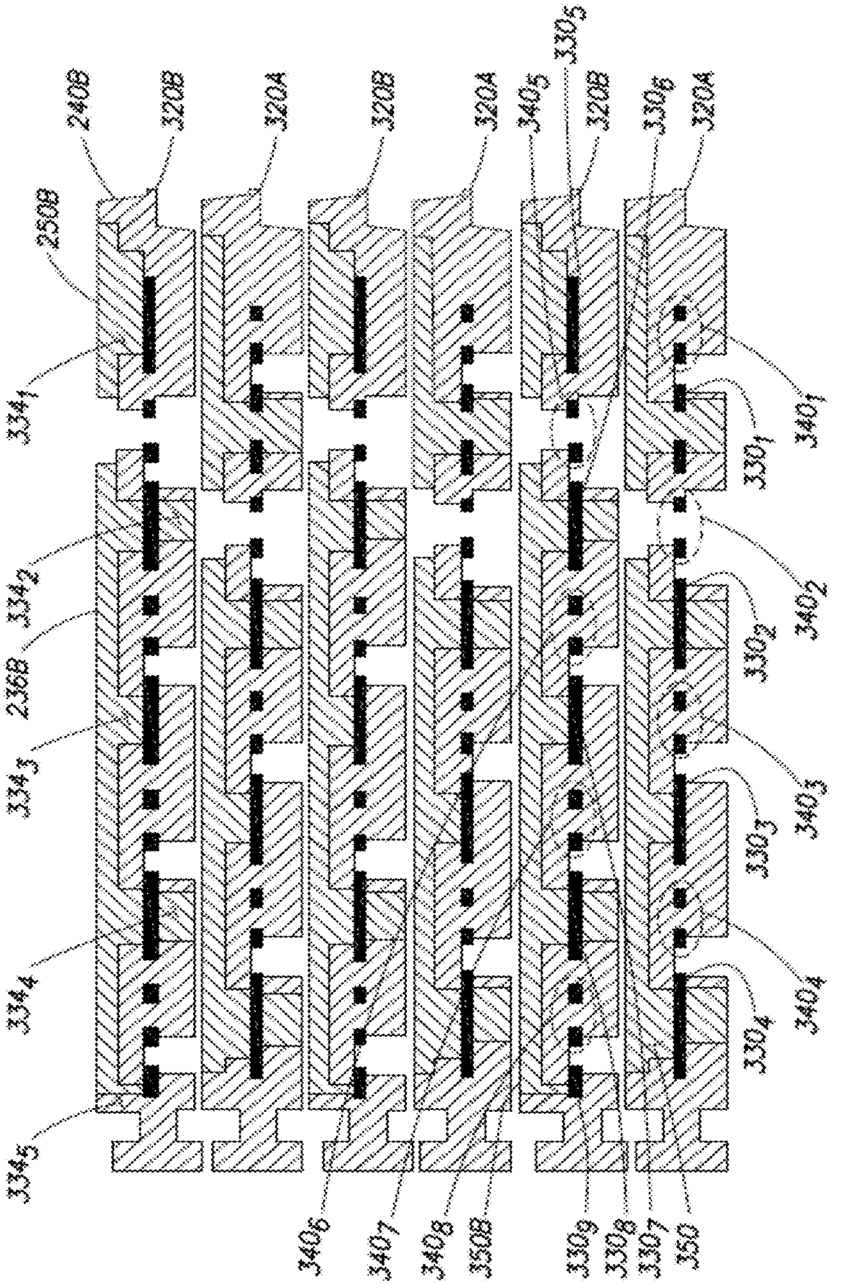
FIG. 3 is a cross-sectional representation of a plurality of wafers stacked together in a connector as in FIG. 1.

Lossy material may also be positioned to reduce the crosstalk between adjacent pairs in different columns. FIG. 3 illustrates a cross-sectional view similar to FIG. 2C but with a plurality of subassemblies or wafers 320A, 320B aligned side to side to form multiple parallel columns As illustrated in FIG. 3, the plurality of signal conductors 340 may be arranged in differential pairs in a plurality of columns formed by positioning wafers side by side. It is not necessary that each wafer be the same and different types of wafers may be used.

It may be desirable for all types of wafers used to construct a daughter card connector to have an outer envelope of approximately the same dimensions so that all wafers fit within the same enclosure or can be attached to the same support member, such as stiffener 128 (FIG. 1). However, by providing different placement of the signal conductors, ground conductors and lossy portions in different wafers, the amount that the lossy material reduces crosstalk relative to the amount that it attenuates signals may be more readily configured. In one embodiment, two types of wafers are used, which are illustrated in FIG. 3 as subassemblies or wafers 320A and 320B.

Each of the wafers 320B may include structures similar to those in wafer 320A as illustrated in FIGS. 2A, 2B and 2C. As shown in FIG. 3, wafers 320B include multiple differential pairs, such as pairs $340_5$, $340_6$, $340_7$ and $340_8$. The signal pairs may be held within an insulative portion, such as 240B of a housing. Slots or other structures, not numbered) may be formed within the housing for skew equalization in the same way that slots $264_1$ . . . $264_6$ are formed in a wafer 220A.

The housing for a wafer 320B may also include lossy portions, such as lossy portions 250B. As with lossy portions 250 described in connection with wafer 320A in FIG. 2C, lossy portions 250B may be positioned to reduce crosstalk between adjacent differential pairs. The lossy portions 250B may be shaped to provide a desirable level of crosstalk suppression without causing an undesired amount of signal attenuation.

In the embodiment illustrated, lossy portion 2509 may have a substantially parallel region 336B that is parallel to the columns of differential pairs $340_5$ . . . $340_8$. Each lossy portion 250B may further include a plurality of perpendicular regions $334_1$B . . . $334_5$B, which extend from the parallel region 336B. The perpendicular regions $334_1$B . . . $334_5$B may be spaced apart and disposed between adjacent differential pairs within a column.

Wafers 320B also include ground conductors, such as ground conductors $330_5$ . . . $330_9$. As with wafers 320A, the ground conductors are positioned adjacent differential pairs $340_5$ . . . $340_8$. Also, as in wafers 320A, the ground conductors generally have a width greater than the width of the signal conductors. In the embodiment pictured in FIG. 3, ground conductors $330_5$ . . . $330_8$ have generally the same shape as ground conductors $330_1$ . . . $330_4$ in a wafer 320A. However, in the embodiment illustrated, ground conductor $330_9$ has a width that is less than the ground conductors $330_5$ . . . $330_8$ in wafer 320B.

Ground conductor $330_9$ is narrower to provide desired electrical properties without requiring the wafer 320B to be undesirably wide. Ground conductor $330_9$ has an edge facing differential pair $340_8$. Accordingly, differential pair $340_8$ is positioned relative to a ground conductor similarly to adjacent differential pairs, such as differential pair $330_8$ in wafer 320B or pair $340_4$ in a wafer 320A. As a result, the electrical properties of differential pair $340_8$ are similar to those of other differential pairs. By making ground conductor $330_9$ narrower than ground conductors $330_8$ or $330_4$, wafer 320B may be made with a smaller size.

A similar small ground conductor could be included in wafer 320A adjacent pair $340_1$. However, in the embodiment illustrated, pair $340_1$ is the shortest of all differential pairs within daughter card connector 120. Though including a narrow ground conductor in wafer 320A could make the ground configuration of differential pair $340_1$ more similar to the configuration of adjacent differential pairs in wafers 320A and 320B, the net effect of differences in ground configuration may be proportional to the length of the conductor over which those differences exist. Because differential pair $340_1$ is relatively short, in the embodiment of FIG. 3, a second ground conductor adjacent to differential pair $340_1$, though it would change the electrical characteristics of that pair, may have relatively little net effect. However, in other embodiments, a further ground conductor may be included in wafers 320A. FIG. 3 illustrates in narrow ground conductor $330_9$, a possible approach for providing a grounding structure adjacent pair 350B. However, the invention is not limited to this specific ground structure.

FIG. 3 illustrates a further feature possible when using multiple types of wafers to form a daughter card connector. Because the columns of contacts in wafers 320A and 320B have different configurations, when wafer 320A is placed side by side with wafer 320B, the differential pairs in wafer 320A are more closely aligned with ground. conductors in wafer 320B than with adjacent pairs of signal conductors in wafer 320B. Conversely, the differential pairs of wafer 320B are more closely aligned with ground conductors than adjacent differential pairs in the wafer 320A.

For example, differential pair $340_6$ is proximate ground conductor $330_2$ in wafer 320A. Similarly, differential pair $340_3$ in wafer 320A is proximate ground conductor $330_7$ in wafer 320B. In this way, radiation from a differential pair in one column couples more strongly to a ground conductor in an adjacent column than to a signal conductor in that column This configuration reduces crosstalk between differential pairs in adjacent columns.

Wafers with different configurations may be formed in any suitable way. FIG. 4A illustrates a step in the manufacture of wafers 320A and 320B according to one embodiment. In the illustrated embodiment, wafer strip assemblies, each containing conductive elements in a configuration desired for one column of a daughter card connector, are formed. A housing is then molded around the conductive elements in each wafer strip assembly in an insert molding operation to form a wafer.

To facilitate the manufacture of wafers, signal conductors, of which signal conductor 420 is numbered and ground conductors, of which ground conductor 430 is numbered, may be held together to form a lead frame 400 as shown in FIG. 4A. As shown, the signal conductors 420 and the ground conductors 430 are attached to one or more carrier strips 402. In some embodiments, the signal conductors and ground conductors are stamped for many wafers on a single sheet. The sheet may be metal or may be any other material that is conductive and provides suitable mechanical properties for making a conductive element in an electrical connector. Phosphor-bronze, beryllium copper and other copper alloys are example of materials that may be used.

FIG. 4A illustrates a portion of a sheet of metal in which wafer strip assemblies 410A, 410B have been stamped. Wafer strip assemblies 410A, 410B may be used to form wafers 320A and 320B, respectively. Conductive elements may be retained in a desired position on carrier strips 402. The conductive elements may then be more readily handled during manufacture of wafers. Once material is molded around the conductive elements of the lead frame, the carrier strips may be severed to separate the conductive elements. The wafers may then be assembled into daughter board connectors of any suitable size.

FIG. 4A also provides a more detailed view of features of the conductive elements of the daughter card wafers. The width of a ground conductor, such as ground conductor 430, relative to a signal conductor, such as signal conductor 420, is apparent. Also, openings in ground conductors, such as opening 332, are visible.

The wafer strip assemblies shown in FIG. 4A provide just one example of a component that may be used in the manufacture of wafers. For example, in the embodiment illustrated in FIG. 4A, the lead frame 400 includes tie bars 452, 454 and 456 that connect various portions of the signal conductors 420 and/or ground strips 430 to the lead frame 400. These tie bars may be severed during subsequent manufacturing processes to provide electronically separate conductive elements. A sheet of metal may be stamped such that one or more additional carrier strips are formed at other locations and/or bridging members between conductive elements may be employed for positioning and support of the conductive elements during manufacture. Accordingly, the details shown in FIG. 4A are illustrative and not a limitation on the invention.

Although the lead frame 400 is shown as including both ground conductors 430 and the signal conductors 420, the present invention is not limited in this respect. For example, the respective conductors may be formed in two separate lead frames. Indeed, no lead frame need be used and individual conductive elements may be employed during manufacture. It should be appreciated that molding over one or both lead frames or the individual conductive elements need not be performed at all, as the wafer may be assembled by inserting ground conductors and signal conductors into preformed housing portions, which may then be secured together with various features including snap fit features.

Figure 4B:
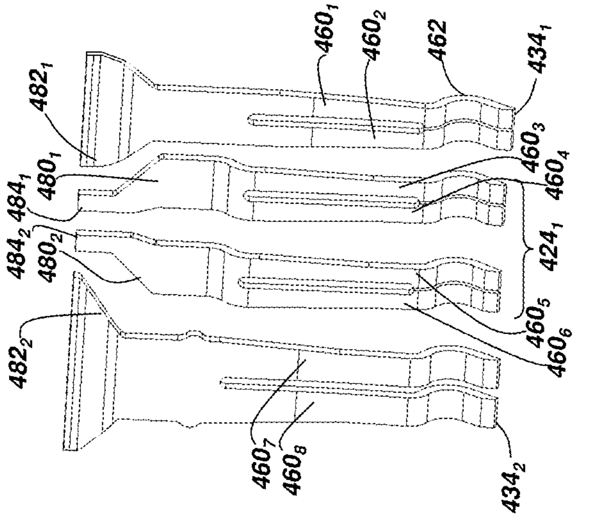
FIG. 4B is an enlarged detail view of the area encircled by arrow 4B-4B in FIG. 4A.
Figure 4A:
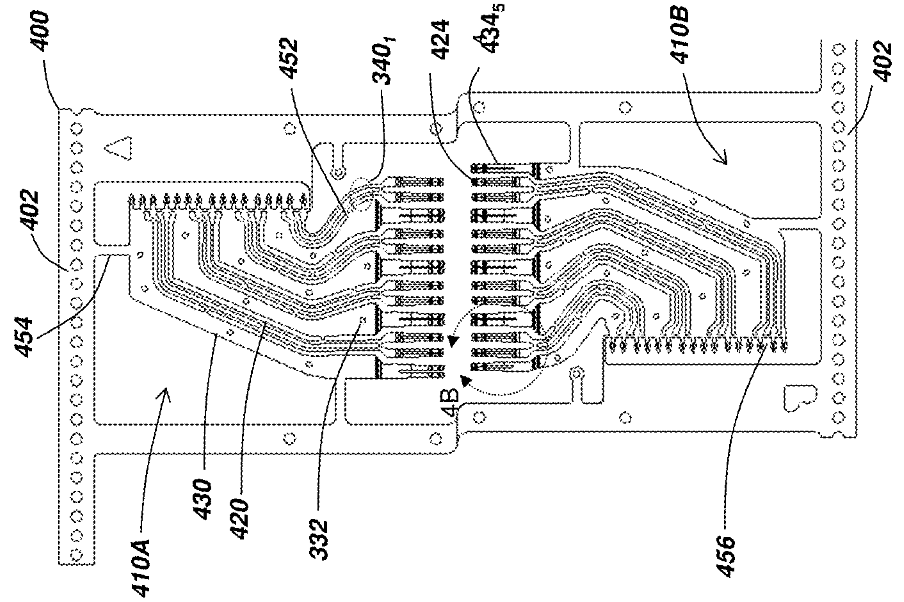
FIG. 4A is a plan view of a lead frame used in the manufacture of the connector of FIG. 1.

FIG. 4B illustrates a detailed view of the mating contact end of a differential pair $\mathbf{424}_1$ positioned between two ground mating contacts $\mathbf{434}_1$ and $\mathbf{434}_2$. As illustrated, the ground conductors may include mating contacts of different sizes. The embodiment pictured has a large mating contact $\mathbf{434}_2$ and a small mating contact $\mathbf{434}_1$. To reduce the size of each wafer, small mating contacts $\mathbf{434}_1$ may be positioned on one or both ends of the war. Though, in embodiments in which it is desirable to increase the overall density of the connector, all of the ground conductors may have dimensions comparable to small mating contact $\mathbf{434}_1$, which is slightly wider than the signal conductors of differential pair $\mathbf{424}_1$. In yet other embodiments, the mating contact portions of both signal and ground conductors may be of approximately the same width.

FIG. 4B illustrates features of the mating contact portions of the conductive elements within the wafers forming daughter board connector 120. FIG. 4B illustrates a portion of the mating contacts of a wafer configured as wafer 320B. The portion shown illustrates a mating contact $\mathbf{434}_1$ such as may be used at the end of a ground conductor $\mathbf{330}_9$ (FIG. 3). Mating contacts $\mathbf{424}_1$ may form the mating contact portions of signal conductors, such as those in differential pair $\mathbf{340}_8$ (FIG. 3). Likewise, mating contact $\mathbf{434}_2$ may form the mating contact portion of a ground conductor, such as ground conductor $\mathbf{330}_8$ (FIG. 3).

In the embodiment illustrated in FIG. 4B, each of the mating contacts on a conductive element in a daughter card wafer is a dual beam contact. Mating contact $\mathbf{434}_1$ includes beams $\mathbf{460}_1$ and $\mathbf{460}_2$. Mating contacts $\mathbf{424}_1$ includes four beams, two for each of the signal conductors of the differential pair terminated by mating contact $\mathbf{424}_1$. In the illustration of FIG. 4B, beams $\mathbf{460}_3$ and $\mathbf{460}_4$ provide two beams for a contact for one signal conductor of the pair and beams $\mathbf{460}_5$ and $\mathbf{460}_6$ provide two beams for a contact for a second signal conductor of the pair. Likewise, mating contact $\mathbf{434}_2$ includes two beams $\mathbf{460}_7$ and $\mathbf{460}_8$.

Each of the beams includes a mating surface, of which mating surface 462 on beam $\mathbf{460}_1$ is numbered. To form a reliable electrical connection between a conductive element in the daughter card connector 120 and a corresponding conductive element in backplane connector 150, each of the beams $\mathbf{460}_1$ . . . $\mathbf{460}_8$ may be shaped to press against a corresponding mating contact in the backplane connector 150 with sufficient mechanical force to create a reliable electrical connection. Having two beams per contact increases the likelihood that an electrical connection will be formed even if one beam is damaged, contaminated or otherwise precluded from making an effective connection.

Each of beams $\mathbf{460}_1$ . . . $\mathbf{460}_8$ has a shape that generates mechanical force for making an electrical connection to a corresponding contact. In the embodiment of FIG. 4B, the signal conductors terminating at mating contact $\mathbf{424}_1$ may have relatively narrow intermediate portions $\mathbf{484}_1$ and $\mathbf{484}_2$ within the housing of wafer 320D. However, to form an effective electrical connection, the mating contact portions $\mathbf{424}_1$ for the signal conductors may be wider than the intermediate portions $\mathbf{484}_1$ and $\mathbf{484}_2$. Accordingly, FIG. 4B shows broadening portions $\mathbf{480}_1$ and $\mathbf{480}_2$ associated with each of the signal conductors.

In the illustrated embodiment, the ground conductors adjacent broadening portions $\mathbf{480}_1$ and $\mathbf{480}_2$ are shaped to conform to the adjacent edge of the signal conductors. Accordingly, mating contact $\mathbf{434}_1$ for a ground conductor has a complementary, portion $\mathbf{482}_1$ with a shape that conforms to broadening portion $\mathbf{480}_1$. Likewise, mating contact $\mathbf{434}_2$ has a complementary portion $\mathbf{482}_2$ that conforms to broadening portion $\mathbf{480}_2$. By incorporating complementary portions in the ground conductors, the edge-to-edge spacing between the signal conductors and adjacent ground conductors remains relatively constant, even as the width of the signal conductors change at the mating contact region to provide desired mechanical properties to the beams. Maintaining a uniform spacing may further contribute to desirable electrical properties for an interconnection system according to an embodiment of the invention.

Some or all of the construction techniques employed within daughter card connector 120 for providing desirable characteristics may be employed in backplane connector 150. In the illustrated embodiment, backplane connector 150, like daughter card connector 120, includes features for providing desirable signal transmission properties. Signal conductors in backplane connector 150 are arranged in columns, each containing differential pairs interspersed with ground conductors. The ground conductors are wide relative to the signal conductors. Also, adjacent columns have different configurations. Some of the columns may have narrow ground conductors at the end to save space while providing a desired ground configuration around signal conductors at the ends of the columns. Additionally, ground conductors in one column may be positioned adjacent to differential pairs in an adjacent column as a way to reduce crosstalk from one column to the next. Further, lossy material may be selectively placed within the shroud of backplane connector 150 to reduce crosstalk, without providing an undesirable level of attenuation to signals. Further, adjacent signals and grounds may have conforming portions so that in locations where the profile of either a signal conductor or a ground conductor changes, the signal-to-ground spacing may be maintained.

Figure 5B:
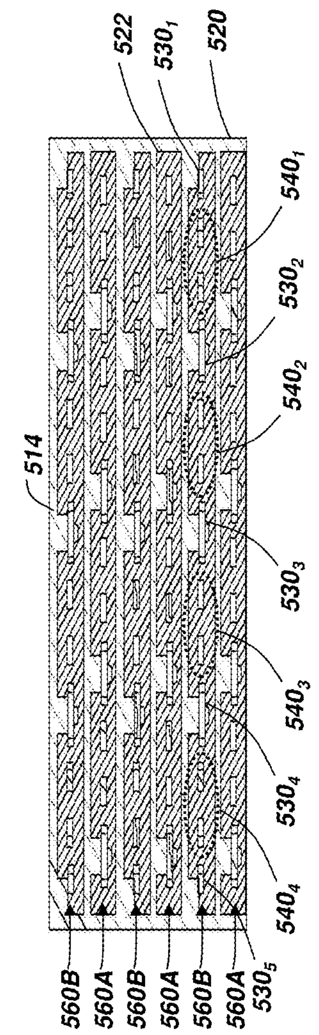
FIG. 5B is a cross-sectional representation of the backplane connector illustrated in FIG. 5A taken along the line 5B-5B.

FIGS. 5A-5B illustrate an embodiment of a backplane connector 150 in greater detail. In the illustrated embodiment, backplane connector 150 includes a shroud 510 with walls 512 and floor 514. Conductive elements are inserted into shroud 510. The embodiment shown, each conductive element has a portion extending above floor 514. These portions form the mating contact portions of the conductive elements, collectively numbered 154. Each conductive element has a portion extending below floor 514. These portions form the contact tails and are collectively numbered 156.

The conductive elements of backplane connector 150 are positioned to align with the conductive elements in daughter card connector 120. Accordingly, FIG. 5A shows conductive elements in backplane connector 150 arranged in multiple parallel columns. In the embodiment illustrated, each of the parallel columns includes multiple differential pairs of signal conductors, of which differential pairs $\mathbf{540}_1$, $\mathbf{540}_2$ . . . $\mathbf{540}_4$ are numbered. Each column also includes multiple ground conductors. In the embodiment illustrated in FIG. 5A, ground conductors $\mathbf{530}_1$, $\mathbf{530}_2$ . . . $\mathbf{530}_5$ are numbered.

Ground conductors $\mathbf{530}_1$ . . . $\mathbf{530}_5$ and differential pairs $\mathbf{540}_1$ . . . $\mathbf{540}_4$ are positioned to form one column of conductive elements within backplane connector 150. That column has conductive elements positioned to align with a column of conductive elements as in a wafer 320B (FIG. 3). An adjacent column of conductive elements within backplane connector 150 may have conductive elements positioned to align with mating contact portions of a wafer 320A. The columns in backplane connector 150 may alternate configurations from column to column to match the alternating pattern of wafers 320A, 320B shown in FIG. 3.

Ground conductors $\mathbf{530}_2$, $\mathbf{530}_3$ and $\mathbf{530}_4$ are shown to be wide relative to the signal conductors that make up the differential pairs by $\mathbf{540}_1$ . . . $\mathbf{540}_4$. Narrower ground conductive elements, which are narrower relative to ground conductors $\mathbf{530}_2$, $\mathbf{530}_3$ and $\mathbf{530}_4$, are included at each end of the column. In the embodiment illustrated in FIG. 5A, narrower ground conductors $\mathbf{530}_1$ and $\mathbf{530}_5$ are including at the ends of the column containing differential pairs $\mathbf{540}_1$ . . . $\mathbf{540}_4$ and may, for example, mate with a ground conductor from daughter card 120 with a mating contact portion shaped as mating contact $\mathbf{434}_1$ (FIG. 4B).

FIG. 5B shows a view of backplane connector 150 taken along the line labeled B-B in FIG. 5A. In the illustration of FIG. 5B, an alternating pattern of columns of 560A-560B is visible. A column containing differential pairs $\mathbf{540}_1$ . . . $\mathbf{540}_4$ is shown as column 560B.

FIG. 5B shows that shroud 510 may contain both insulative and lossy regions. In the illustrated embodiment, each of the conductive elements of a differential pair, such as differential pairs $\mathbf{540}_1$ . . . $\mathbf{540}_4$, is held within an insulative region 522. Lossy regions 520 may be positioned between adjacent differential pairs within the same column and between adjacent differential pairs in adjacent columns. Lossy regions 520 may connect to the ground contacts such as $\mathbf{530}_1$ . . . $\mathbf{530}_5$. Sidewalls 512 may be made of either insulative or lossy material.

FIGS. 6A, 6B and 6C illustrate in greater detail conductive elements that may be used in forming backplane connector 150. FIG. 6A shows multiple wide ground contacts $\mathbf{530}_2$, $\mathbf{530}_3$ and $\mathbf{530}_4$. In the configuration shown in FIG. 6A, the ground contacts are attached to a carrier strip 620. The ground contacts may be stamped from a long sheet of metal or other conductive material, including a carrier strip 620. The individual contacts may be severed from carrier strip 620 at any suitable time during the manufacturing operation.

As can be seen, each of the ground contacts has a mating contact portion shaped as a blade. For additional stiffness, one or more stiffening structures may be formed in each contact. In the embodiment of FIG. 6A, a rib, such as 610 is formed in each of the wide ground conductors.

Each of the wide ground conductors, such as $\mathbf{530}_2$ . . . $\mathbf{530}_4$ includes two contact tails. For ground conductor $\mathbf{530}_2$ contact tails $\mathbf{656}_1$ and $\mathbf{656}_2$ are numbered. Providing two contact tails per wide ground conductor provides for a more even distribution of grounding structures throughout the entire interconnection system, including within backplane 160, because each of contact tails $\mathbf{656}_1$ and $\mathbf{656}_2$ will engage a ground via within backplane 160 that will be parallel and adjacent a via carrying a signal. FIG. 4A illustrates that two ground contact tails may also be used for each ground conductor in a daughter card connector.

FIG. 6B shows a stamping containing narrower ground conductors, such as ground conductors $\mathbf{530}_1$ and $\mathbf{530}_5$. As with the wider ground conductors shown in FIG. 6A, the narrower ground conductors of FIG. 6B have a mating contact portion shaped like a blade.

As with the stamping of FIG. 6A, the stamping of FIG. 6B containing narrower grounds includes a carrier strip 630 to facilitate handling of the conductive elements.

The individual ground conductors may be severed from carrier strip 630 at any suitable time, either before or after insertion into backplane connector shroud 510.

In the embodiment illustrated, each of the narrower ground conductors, such as $\mathbf{530}_1$ and $\mathbf{530}_2$, contains a single contact tail such as $\mathbf{656}_3$ on ground conductor $\mathbf{530}_1$ or contact tail $\mathbf{656}_4$ on ground conductor $\mathbf{530}_5$. Even though only one ground contact tail is included, the relationship between number of signal contacts is maintained because narrow ground conductors as shown in FIG. 6B are used at the ends of columns where they are adjacent a single signal conductor. As can be seen from the illustration in FIG. 6B, each of the contact tails for a narrower ground conductor is offset from the center line of the mating contact in the same way that contact tails $\mathbf{656}_1$ and $\mathbf{656}_2$ are displaced from the center line of wide contacts. This configuration may be used to preserve the spacing between a ground contact tail and an adjacent signal contact tail.

As can be seen in FIG. 5A, in the pictured embodiment of backplane connector 150, the narrower ground conductors, such as $\mathbf{530}_1$ and $\mathbf{530}_5$, are also shorter than the wider ground conductors such as $\mathbf{530}_2$ . . . $\mathbf{530}_4$. The narrower ground conductors shown in FIG. 6B do not include a stiffening structure, such as ribs 610 (FIG. 6A). However, embodiments of narrower ground conductors may be formed with stiffening structures.

FIG. 6C shows signal conductors that may be used to form backplane connector 150. The signal conductors in FIG. 6C, like the ground conductors of FIGS. 6A and 6B, may be stamped from a sheet of metal. In the embodiment of FIG. 6C, the signal conductors are stamped in pairs, such as pairs $540_1$ and $540_2$. The stamping of FIG. 6C includes a carrier strip 640 to facilitate handling of the conductive elements. The pairs, such as $540_1$ and $540_2$, may be severed from carrier strip 640 at any suitable point during manufacture.

As can be seen from FIGS. 5A, 6A, 6B and 6C, the signal conductors and ground conductors for backplane connector 150 may be shaped to conform to each other to maintain a consistent spacing between the signal conductors and ground conductors. For example, ground conductors have projections, such as projection 660, that position the ground conductor relative to floor 514 of shroud 510. The signal conductors have complimentary portions, such as complimentary portion 662 (FIG. 6C) so that when a signal conductor is inserted into shroud 510 next to a ground conductor, the spacing between the edges of the signal conductor and the ground conductor stays relatively uniform, even in the vicinity of projections 660.

Likewise, signal conductors have projections, such as projections 664 (FIG. 6C). Projection 664 may act as a retention feature that holds the signal conductor within the floor 514 of backplane connector shroud 510 (FIG. 5A). Ground conductors may have complimentary portions, such as complementary portion 666 (FIG. 6A). When a signal conductor is placed adjacent a ground conductor, complimentary portion 666 maintains a relatively uniform spacing between the edges of the signal conductor and the ground conductor, even in the vicinity of projection 664. Though, it should be appreciated that the illustrated configuration is exemplary rather than limiting.

FIGS. 6A, 6B and 6C illustrate examples of projections in the edges of signal and ground conductors and corresponding complimentary portions formed in an adjacent signal or ground conductor. Other types of projections may be formed and other shapes of complementary portions may likewise be formed.

To facilitate use of signal and ground conductors with complementary portions, backplane connector 150 may be manufactured by inserting signal conductors and ground conductors into shroud 510 from opposite sides. As can be seen in FIG. 5A, projections such as 660 (FIG. 6A) of ground conductors press against the bottom surface of floor 514. Backplane connector 150 may be assembled by inserting the ground conductors into shroud 510 from the bottom until projections 660 engage the underside of floor 514. Because signal conductors in backplane connector 150 are generally complementary to the ground conductors, the signal conductors have narrow portions adjacent the lower surface of floor 514. The wider portions of the signal conductors are adjacent the top surface of floor 514. Because manufacture of a backplane connector may be simplified if the conductive elements are inserted into shroud 510 narrow end first, backplane connector 150 may be assembled by inserting signal conductors into shroud 510 from the upper surface of floor 514. The signal conductors may be inserted until projections, such as projection 664, engage the upper surface of the floor. Two-sided insertion of conductive elements into shroud 510 facilitates manufacture of connector portions with conforming signal and ground conductors.

Regardless of the specific shape and size of the components and the techniques used to manufacture components of an electrical connector, openings in a insulative housing may result. The openings may lead to recesses in a surface of the insulative housing.

Openings in the insulative housing may change the electrical properties along the signal conductors in such a way that the performance of the interconnection system is limited at high frequencies. FIG. 7A illustrates a scenario in which such openings, formed to support a manufacturing operation in which ties bars of a lead frame are severed, creates openings adjacent signal conductors that cause impedance discontinuity and limit performance at high frequencies, such as in the 10-25 GHz range.

FIG. 7A is a plan view of a wafer, such as wafer 220A, described above. When wafer 220A is incorporated into a connector, region 710 is along the surface of the connector adapted to be mounted to a printed circuit board.

Figure 7B:
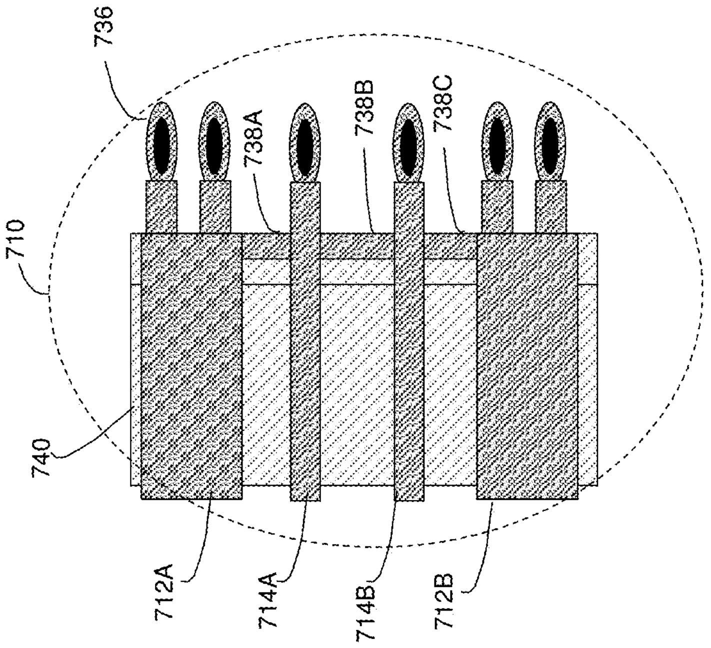
FIG. 7B is an enlarged, schematic illustration of a portion 710 of the wafer prior to severing tie bars in a lead frame.
Figure 7A:
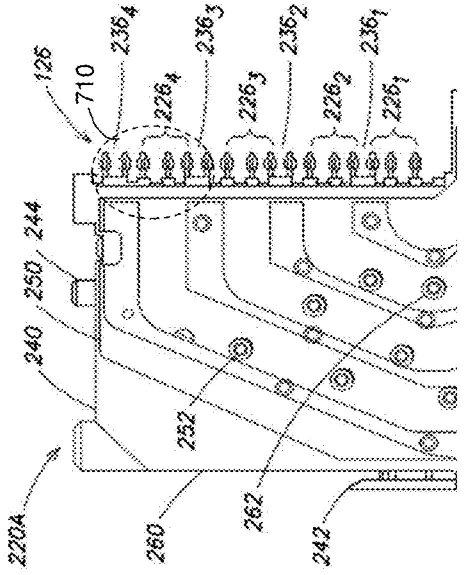
FIG. 7A is a plan view of a wafer of an electrical connector showing a portion of face of the housing for mounting against a printed circuit board.

FIG. 7B illustrates the manner in which those openings may arise. FIG. 7B illustrates the wafer in cross section through a lead frame. As shown, the lead frame includes conductive elements. In this example the conductive elements in region 710 include wider conductive elements 712A and 712B, which may be designated as ground conductors and narrower conductive elements 714A and 714B, which may be designated signal conductors. Each of the conductive elements 712A, 712B, 714A and 714B includes at least one contact tail, of which contact tail 736 is numbered. The contact tails are configured for attachment to a printed circuit board.

In the embodiment illustrated, the conductive elements are stamped as part of a lead frame that includes tie bars. The tie bars, of which tie bars 738A, 738B and 738C are shown, hold the conductive elements with a desired spacing before the conductive elements are held by insulative housing 740.

Figure 8B:
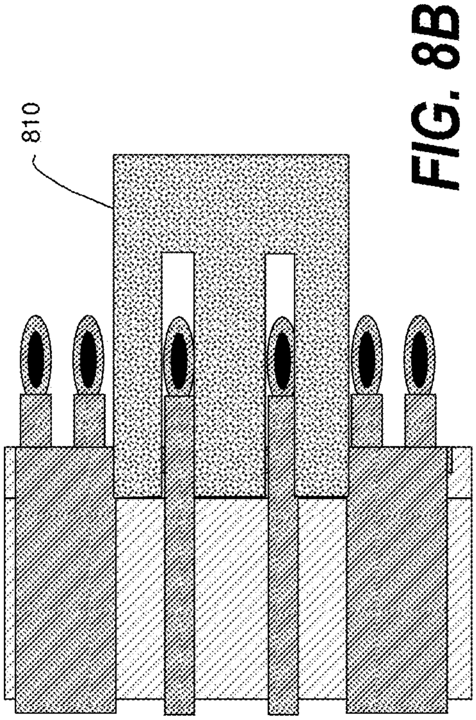
FIGS. 8A and 8B illustrate a tool that may be used to sever tie bars in the lead frame of FIG. 7B.
Figure 8A:
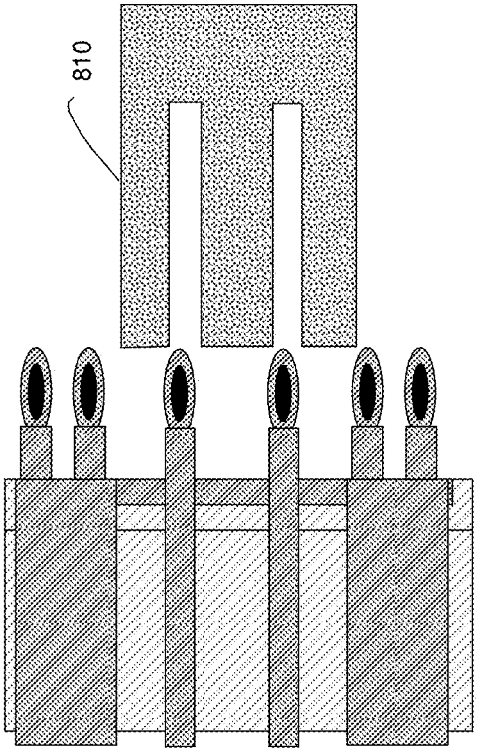

After the insulative housing 740 is molded around the lead frame, the tie bars may be severed. FIG. 8A illustrates a tool 810 that may sever the tie bars. In this example, the tool comprises multiple punches, each shaped to sever a tie bar without severing the conductive elements. FIG. 8B shows tool 810 positioned above the tie bars. In this position, tool 810 may assert force on the tie bars, thereby severing them.

Though the housing 740 molded over the lead frame visible in the cross section of FIG. 8B, in some embodiments, the housing may be molded with openings such that tie bars 738A, . . . 738C are not covered by the housing. Alternatively or additionally, tool 810, as it severs the tie bars, may also cut through portions of the housing to create the openings.

Figure 9A:
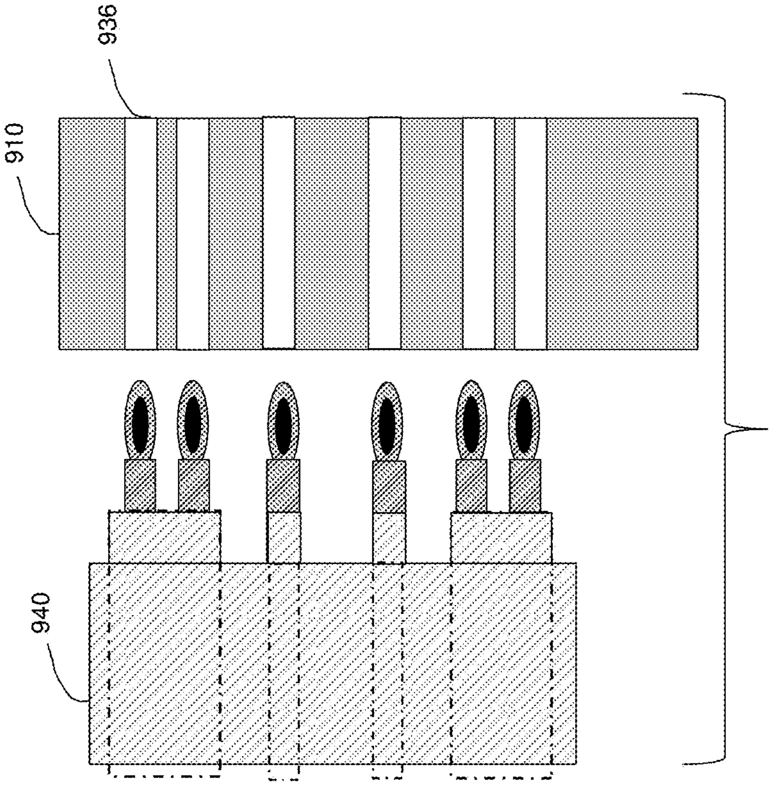
FIGS. 9A and 9B illustrate a conventional approach to mounting a connector, including the wafer of FIG. 7B, with tie bars severed, to a printed circuit board.

Housing 740 may be molded such that, portions of the conductive elements adjacent those openings are covered by housing 740. FIG. 9A shows the same region as in FIGS. 8A and 8B. FIG. 9A is a plan view, rather than a cross section. In FIG. 9A, portions of housing 740 are visible over portions of the conductive elements adjacent the openings through which tool 810 passes.

This configuration of may lead to an undesirable change in impedance along the signal conductors in the vicinity of the contact tails when a connector, made using a wafer as shown in FIG. 9A is mounted to a printed circuit board.

FIG. 9A schematically illustrates a printed circuit board 910 to which the connector 940 may be mounted. In this illustration, a region of printed circuit board 910 is shown in cross section. That region is shown to contain vias, of which via 936 is numbered. The vias are plated holes into which contact tails, such as contact tail 736 may be inserted. When the connector is mounted to printed circuit board 910, the contact tails make mechanical and electrical connection to the plating on the insides of the vias. In this example, the contact tails are press fit contact tails that make electrical and mechanical connection through the use of spring force generated by compressing the contact tail to fit within the via. However, the specific mechanism by which the contact tail is connected to the printed circuit board is not critical.

Figure 9B:
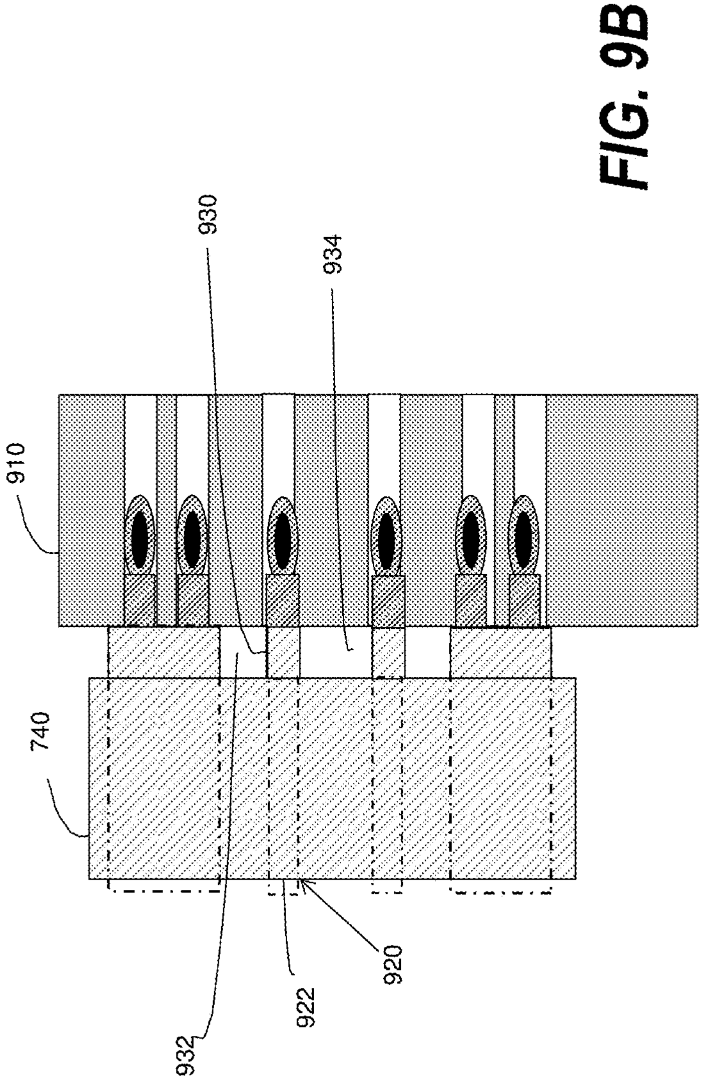

FIG. 9B illustrates the connector attached to printed circuit board 910. As can be seen, the contact tails are engaged within the vias. FIG. 9B illustrates the manner by which an impedance discontinuity may arise as a result of openings left by severing the tie bars. As can be seen, the openings create regions along the signal conductors where the average dielectric constant of the material surrounding the signal conductors changes. Because the dielectric constant impacts the impedance, a change in average dielectric constant impacts impedance. Taking signal conductor 920 as representative, it contains a portion 922 that is embedded within housing 740. As noted above, conventional materials for forming housing 740 may have a relative dielectric constant of about 2.3 to about 4.7.

Cavities 932 and 934 are, in this example, filled with air. Their relative dielectric constant is therefore approximately equal to 1. As a result, the signal path along signal conductor 920 may, in portion 922 be influenced by the relative dielectric constant of housing 740. Portion 930 may have an impedance influenced by the relative dielectric constant of cavities 932 and 934. Thus, an impedance discontinuity may exist between portion 930 and portion 922. A similar impedance discontinuity may exist between portion 930 and the portion of the signal conductor within printed. circuit board 910. The material surrounding the vias, such as via 936, may have a relative dielectric constant similar to that of housing 740. Accordingly, the impedance within the vias may be similar to that in section 922 or will otherwise be different than in section 930.

These changes of impedance generated by cavities 932 and 934 may be significant enough to impact performance of the connector over some range of frequencies. That range of frequencies may encompass higher operating frequencies. For example the change of impedance may be significant over a range above 8 GHz, or, in some embodiments, above 10 GHz. For example, in the range of about 10-25 GHz, the impedance discontinuity may be large enough to degrade signal integrity by a noticeable amount.

Figure 10B:
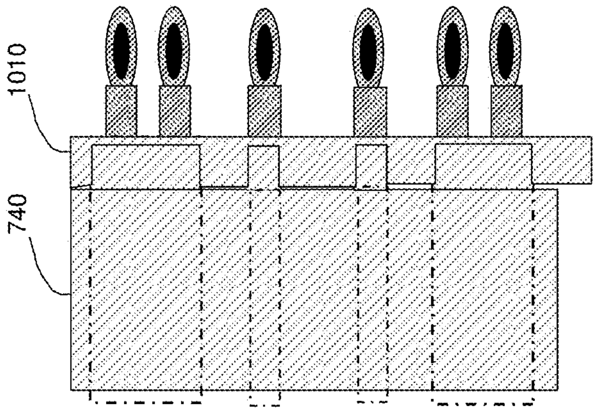
FIGS. 10A, 10B and 10C illustrate mounting a connector, including the wafer of FIG. 7B, with tie bars severed, to a printed circuit board in accordance with some exemplary embodiments of a technique for improving high frequency performance of the connector.
Figure 10A:
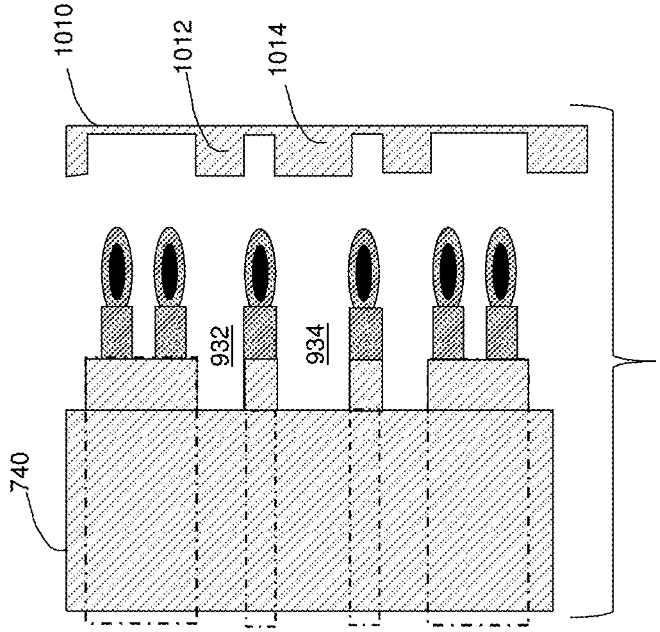

FIG. 10A illustrates an approach for reducing the effect of impedance discontinuity caused by cavities in the surface to press against a printed circuit board. As illustrated in FIG. 10A, an insulative member 1010 may be inserted into the openings such that the cavities are filled. Insulative member 1010 may have projections 1012 and 1014 aligned to fit within the cavities. For example projections 102 and 1014 are sized and positioned to align with cavities 932 and 934.

FIG. 10B illustrates the insulative member 1010 with projecting portions inserted into the cavities. In the configuration, insulative member 1010 effectively extends the housing 740 into openings formed to accommodate a tool used to punch out a tie bar.

Figure 10C:
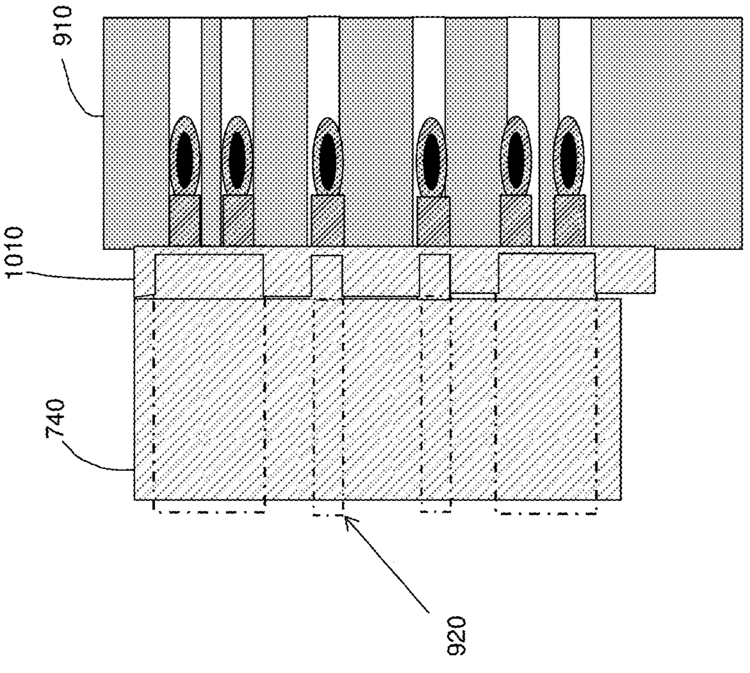

FIG. 10C illustrates that connector, with the housing formed of two pieces, housing portion 740 and housing portion 910. In the embodiment illustrated, insulative member 1010 may be made of material that has a dielectric constant similar to that of housing portion 740. As a result, the signal conductors within the electrical connector may be surrounded by a dielectric material that has approximately the same dielectric constant throughout the entire connector housing. Moreover, the face of the connector adapted for attachment to a printed circuit board has the profile of the surface of insulative member 1010. As shown, for example, in FIG. 10A, this surface may be shaped to conform to the surface of the printed circuit board, such that there are no cavities formed in the surface of the electrical connector mounted against the printed circuit board.

Figure 11B:
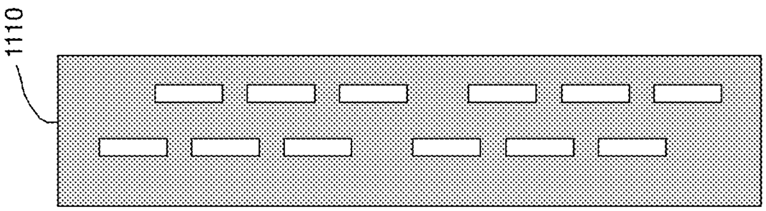
FIGS. 11A and 11B illustrate, in plan view, alternative embodiments of a housing portion for use in connection with a high frequency electrical connector.
Figure 11A:
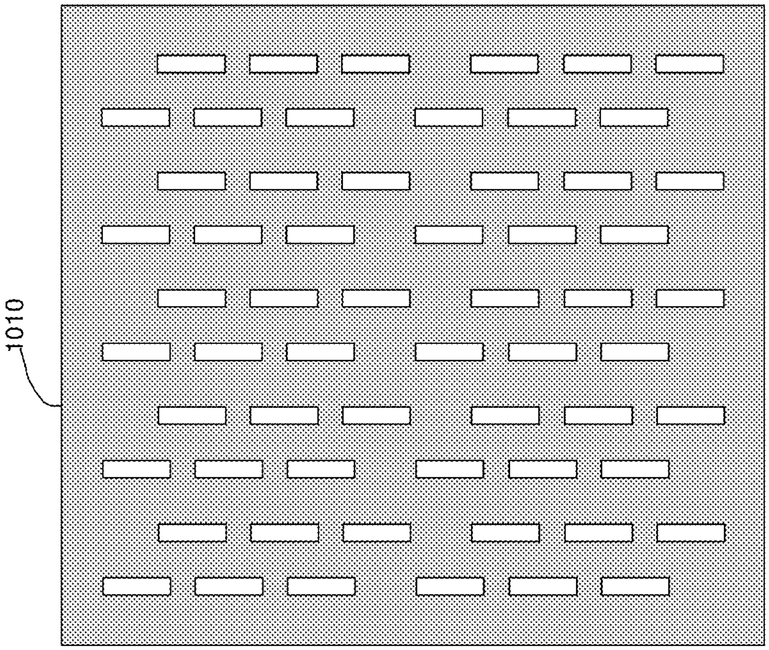

FIG. 11A illustrates a lower surface of insulative member 1010, according to some embodiments. In this example, insulative member 1010 is adapted to be applied to a connector module with 10 columns of conductive elements. Such a connector module may be formed, for example, from 10 wafers, each with one column of conductive elements. FIG. 11A is a plan view showing a surface of insulative member 1010 adapted to face a printed circuit board when the connector is mounted to the printed circuit board. In this example, that face is flat, to conform to the contour of the printed circuit board without leaving openings that could give rise to impedance discontinuities.

As shown in FIG. 11A, insulative member 1010 has multiple columns of openings. These openings may correspond to contact tails of conductive elements protruding through a surface of a connector. The surface may, as in the exemplary embodiment of FIG. 1, be formed from surfaces of multiple wafers with contact tails 126 extending through the surface. In the example of FIG. 11A, insulative member 1010, having ten columns, is sized to conform to a connector module formed of ten wafers, each with one column of conductive elements.

However, the size of insulative member 1010 is not critical to the invention. For example, FIG. 11B shows an insulative member 1110 that may be sized to fit onto two wafers, each with one column. In such an embodiment, multiple insulative members may be used for a connector or a connector module. In other embodiments, though, an insulative module may fit over more or fewer wafers. Moreover, it is not a requirement that the insulative member be elongated in a direction that corresponds with a dimension of a wafer. In some embodiments, the insulative members may be oriented with an elongated dimension that is transverse to the column direction established by multiple wafers. Further, it is not a requirement that each insulative member be elongated at all. Insulative members may be sized to fit within on or a small number of openings in a connector housing.

The opposite surface of the conductive members, though not visible in FIG. 11A, may have multiple projections, like projections 1012 and 1014 (FIG. 10A). Each of the projections may be positioned to align with, and occupy a cavity in a connector housing. The projections may be arranged in rows and columns or in any suitable pattern that matches a pattern of openings that is to be occupied by the insulative member.

Having thus described several aspects of at least one embodiment of this invention, it is to be appreciated various alterations, modifications, and improvements will readily occur to those skilled in the art.

As one example, embodiments were described in which the intermediate portion of conductive members was fully encapsulated within one housing portion. In other embodiments, the intermediate portions of the conductive elements may be partially held within the insulative housing.

As another example, techniques for improving high frequency performance of an interconnection system using dielectric inserts were described in connection inserts for filling cavities in a surface of a connector adapted for mounting against a printed circuit board. Inserts may be similarly used to fill cavities in other portions of the connector, including cavities formed to allow tie bars in intermediate portions of the conductive elements to be severed.

As another example, frequencies in the range of 10-25 GHz was provided as an example of an operating range. However, it should be appreciated that other ranges may be used and that those ranges may span higher or lower frequencies, such as up to 30, 35 or 40 GHz, or may end at lower frequencies, such as 20, or 15 GHz.

As yet another example of possible variations, it was described above that an insulative member, such as insulative member 1010, is formed of a material with the same dielectric constant as housing 740 to reduce any impedance discontinuity at the board interface surface of the connector. It should be appreciated that other factors may impact impedance such that the dielectric constant of insulative member 1010 may be selected to equalize impedance across the signal conductors rather than to equal the dielectric constant of the another housing portion. For example, the thickness or width of a signal conductor may also impact its impedance. If the thickness and/or width a signal conductor in portions 930 is different than in portion 922, the dielectric constant of insulative member 1010 may be greater or less than that of housing 740, and may be selected to equalize impedance.

Further, it should be appreciated that embodiments are described in which an insulative member or members are applied to a connector to avoid openings in the housing adjacent portions of the length of any signal conductor. It should be appreciated that it is not a requirement that an insulative member by attached to fill all openings adjacent all signal conductors. In some interconnection systems, for example, some signal conductors carry low frequency signals such that a change in the dielectric constant of material surrounding a portion of the signal conductors does not impact performance. For these conductive elements, the adjacent openings in a housing portion may not be filled with another housing portion.

As for other possible variations, examples of techniques for modifying characteristics of an electrical connector were described. These techniques may be used alone or in any suitable combination.

Further, although many inventive aspects are shown and described with reference to a daughter board connector, it should be appreciated that the present invention is not limited in this regard, as the inventive concepts may be included in other types of electrical connectors, such as backplane connectors, cable connectors, stacking connectors, mezzanine connectors, or chip sockets.

As a further example of possible variations, connectors with four differential signal pairs in a column were described. However, connectors with any desired number of signal conductors may be used.

This invention is not limited in its application to the details of construction and the arrangement of components set forth in the above description or illustrated in the drawings. The invention is capable of other embodiments and of being practiced or of being carried out in various ways. Also, the phraseology and terminology used herein is for the purpose of description and should not be regarded as limiting. The use of “including,” “comprising,” “having,” “containing,” or “involving,” and variations thereof herein, is meant to encompass the items listed thereafter and equivalents thereof as well as additional items.

Such alterations, modifications, and improvements are intended to be part of this disclosure, and are intended to be within the spirit and scope of the invention. Accordingly, the foregoing description and drawings are by way of example only.

What is claimed is:

1. A method of manufacturing an electrical connector, the method comprising:

molding a housing around a lead frame, the lead frame comprising a plurality of conductive members, the plurality of conductive members being joined by a plurality of tie bars;

subsequent to the molding, with at least one punch, severing the tie bars, the at least one punch passing through open areas of the housing to access the tie bars; and inserting insulative members in the open areas.

2. The method of claim 1, wherein:

the lead frame and housing form a first subassembly;

the method further comprises:

forming a plurality of subassemblies, each subassembly comprising a lead frame, a housing and a plurality of open areas in the housing; and forming a module by attaching the plurality of subassemblies to a support structure; and inserting insulative members in the open areas comprises positioning a unitary component comprising a plurality of projections into the open areas of the plurality of subassemblies.

3. The method of claim 2, wherein:

molding the housing comprises molding the housing with the openings exposing the tie bars.

4. The electrical connector of claim 3, wherein:

severing the tie bars comprises inserting the punch and a corresponding die in openings of the housing such that the ties bars are severed without removing housing material.

5. The electrical connector of claim 3, wherein:

molding the housing comprises molding the housing in a multi-shot molding operation, with one shot injecting insulative material and a second shot injecting lossy material.

6. The method of claim 1, wherein:

each of the plurality of conductive members comprises a contact tail, a mating contact, and an intermediate portion joining the contact tail and the mating contact; and inserting the insulative members in the open areas comprises passing the contact tails of the plurality of conductive members through the insulative members.

7. The method of claim 1, wherein:

each of the plurality of conductive members comprises a contact tail, a mating contact, and an intermediate portion joining the contact tail and the mating contact; and the tie bars are at intermediate portions of the plurality of conductive members.

* * * * *